(12) United States Patent
Peppas et al.

(10) Patent No.: US 12,437,906 B2
(45) Date of Patent: Oct. 7, 2025

(54) SURGE PROTECTIVE DEVICES

(71) Applicant: RAYCAP, S.A., Athens (GR)

(72) Inventors: Georgios Peppas, Kalloni Troizinias (GR); Alexis Chorozoglou, Drama (GR); Elias Fermelis, Koropi (GR); Zafiris G. Politis, St. Stefanos (GR)

(73) Assignee: RAYCAP, S.A., Athens (GR)

( * ) Notice: Subject to any disclaimer, the term of this patent is extended or adjusted under 35 U.S.C. 154(b) by 150 days.

(21) Appl. No.: 18/487,155

(22) Filed: Oct. 16, 2023

(65) Prior Publication Data

US 2024/0127991 A1   Apr. 18, 2024

Related U.S. Application Data

(60) Provisional application No. 63/380,048, filed on Oct. 18, 2022.

(51) Int. Cl.
| | |
|---|---|
| *H01C 7/12* | (2006.01) |
| *H01C 1/02* | (2006.01) |
| *H05K 1/02* | (2006.01) |
| *H05K 1/18* | (2006.01) |

(52) U.S. Cl.
CPC ............... *H01C 7/12* (2013.01); *H01C 1/02* (2013.01); *H05K 1/0213* (2013.01); *H05K 1/0218* (2013.01); *H05K 1/18* (2013.01); *H05K 2201/10022* (2013.01)

(58) Field of Classification Search
CPC ... H01C 1/02; H01C 1/14; H01C 7/12; H01C 7/123; H05K 1/0213; H05K 1/0218; H05K 1/18; H05K 2201/10022
USPC ........................................................ 361/91.2
See application file for complete search history.

(56) References Cited

U.S. PATENT DOCUMENTS

| | | | |
|---|---|---|---|
| 1,144,029 A | 6/1915 | Creighton | |
| 2,158,859 A | 5/1939 | Shinichiro | |
| 2,311,758 A | 2/1943 | Johansson | |
| 2,805,294 A | 9/1957 | Edmunds | |
| 2,971,132 A | 2/1961 | Nash | |
| 3,249,719 A | 5/1966 | Misare et al. | |
| 3,375,405 A | 3/1968 | Chiffee et al. | |
| 3,522,570 A | 8/1970 | Wanaselja | |
| 3,711,794 A | 1/1973 | Tasca et al. | |
| 3,743,996 A | 7/1973 | Harnden | |
| 3,813,577 A | 5/1974 | Kawiecke | |

(Continued)

FOREIGN PATENT DOCUMENTS

| | | |
|---|---|---|
| CA | 2098365 A1 | 12/1993 |
| CH | 466427 A | 12/1968 |

(Continued)

OTHER PUBLICATIONS

Machine translation of Chen et al. German Patent Document DE 102007014336 B4 Sep. 2018 (Year: 2018).*

(Continued)

*Primary Examiner* — Kevin J Comber
(74) *Attorney, Agent, or Firm* — Myers Bigel, P.A.

(57) ABSTRACT

A surge protective device (SPD) module includes a printed circuit board (PCB), a first electrode, a second electrode, and a varistor electrically connected between the first and second electrodes. The SPD module forms a housing assembly defining a chamber containing the varistor. The PCB forms a portion of the housing assembly.

20 Claims, 26 Drawing Sheets

(56) References Cited

U.S. PATENT DOCUMENTS

| | | |
|---|---|---|
| 3,863,111 A | 1/1975 | Martzloff |
| 4,015,228 A | 3/1977 | Eda et al. |
| 4,023,133 A | 5/1977 | Knapp |
| 4,085,397 A | 4/1978 | Yagher, Jr. |
| 4,092,694 A | 5/1978 | Stetson |
| 4,217,618 A | 8/1980 | Kellenbenz et al. |
| 4,240,124 A | 12/1980 | Westrom |
| 4,241,374 A | 12/1980 | Gilberts |
| 4,249,224 A | 2/1981 | Baumbach |
| 4,288,833 A | 9/1981 | Howell |
| 4,355,345 A | 10/1982 | Franchet |
| 4,425,017 A | 1/1984 | Chan |
| 4,493,003 A | 1/1985 | Mickelson et al. |
| 4,571,656 A | 2/1986 | Ruckman |
| 4,595,635 A | 6/1986 | Dubrow et al. |
| 4,600,261 A | 7/1986 | Debbaut |
| 4,638,284 A | 1/1987 | Levinson |
| 4,677,518 A | 6/1987 | Hershfield |
| 4,701,574 A | 10/1987 | Shimirak et al. |
| 4,906,963 A | 3/1990 | Ackermann et al. |
| 4,908,730 A | 3/1990 | Westrom |
| 4,956,696 A | 9/1990 | Hoppe et al. |
| 5,006,950 A | 4/1991 | Allina |
| 5,130,884 A | 7/1992 | Allina |
| 5,172,296 A | 12/1992 | Kaczmarek |
| 5,311,164 A | 5/1994 | Ikeda et al. |
| 5,436,786 A | 7/1995 | Pelly et al. |
| 5,519,564 A | 5/1996 | Carpenter |
| 5,523,916 A | 6/1996 | Kaczmarek |
| 5,529,508 A | 6/1996 | Chiotis et al. |
| 5,588,856 A | 12/1996 | Collins et al. |
| 5,608,596 A | 3/1997 | Smith et al. |
| 5,621,599 A | 4/1997 | Larsen et al. |
| 5,652,690 A | 7/1997 | Mansfield et al. |
| 5,721,664 A | 2/1998 | Uken et al. |
| 5,724,221 A | 3/1998 | Law |
| 5,745,322 A | 4/1998 | Duffy et al. |
| 5,781,394 A | 7/1998 | Lorenz et al. |
| 5,808,850 A | 9/1998 | Carpenter |
| 5,812,047 A | 9/1998 | van Kampen |
| 5,936,824 A | 8/1999 | Carpenter |
| 5,982,597 A | 11/1999 | Webb |
| 5,990,778 A | 11/1999 | Struempler et al. |
| 6,038,119 A | 3/2000 | Atkins et al. |
| 6,094,128 A | 7/2000 | Bennett et al. |
| 6,172,865 B1 | 1/2001 | Boy et al. |
| 6,175,480 B1 | 1/2001 | Karmazyn |
| 6,222,433 B1 | 4/2001 | Ramakrishnan et al. |
| 6,226,162 B1 | 5/2001 | Kladar et al. |
| 6,226,166 B1 | 5/2001 | Gumley et al. |
| 6,430,019 B1 | 8/2002 | Martenson et al. |
| 6,430,020 B1* | 8/2002 | Atkins ............... H01C 7/12 361/127 |
| 6,459,559 B1 | 10/2002 | Christofersen |
| 6,556,402 B2 | 4/2003 | Kizis et al. |
| 6,614,640 B2 | 9/2003 | Richter et al. |
| 6,930,871 B2 | 8/2005 | Macanda |
| 7,433,169 B2 | 10/2008 | Kamel et al. |
| 7,558,041 B2 | 7/2009 | Lagnoux |
| 7,684,166 B2 | 3/2010 | Donati et al. |
| 7,738,231 B2 | 6/2010 | Lagnoux |
| 8,493,170 B2 | 7/2013 | Zaeuner et al. |
| 8,659,866 B2 | 2/2014 | Douglass et al. |
| 8,699,197 B2 | 4/2014 | Douglass et al. |
| 8,743,525 B2 | 6/2014 | Xepapas et al. |
| 8,766,762 B2 | 7/2014 | Depping et al. |
| 8,929,042 B2 | 1/2015 | Pfitzer et al. |
| 9,349,548 B2 | 5/2016 | Juricev |
| 9,355,763 B2 | 5/2016 | Xu |
| 9,570,260 B2 | 2/2017 | Yang et al. |
| 9,634,554 B2 | 4/2017 | Falk et al. |
| 9,750,122 B1 | 8/2017 | Elizondo-Decanini |
| 9,906,017 B2 | 2/2018 | Tsovilis et al. |
| 10,050,436 B2 | 8/2018 | Buchanan |
| 10,447,026 B2 | 10/2019 | Kostakis et al. |
| 10,707,678 B2 | 7/2020 | Tavcar et al. |
| 11,527,879 B2 | 12/2022 | Politis et al. |
| 11,723,145 B2 | 8/2023 | Znideric et al. |
| 11,862,967 B2 | 1/2024 | Peppas et al. |
| 2002/0018331 A1 | 2/2002 | Takahashi |
| 2002/0024792 A1 | 2/2002 | Cantagrel |
| 2002/0159212 A1 | 10/2002 | Oughton |
| 2003/0184926 A1 | 10/2003 | Wu et al. |
| 2004/0150937 A1 | 8/2004 | Bobert et al. |
| 2004/0257742 A1 | 12/2004 | Zeller et al. |
| 2005/0185356 A1 | 8/2005 | Durth |
| 2005/0231872 A1 | 10/2005 | Schimanski et al. |
| 2006/0034031 A1 | 2/2006 | Lehuede |
| 2006/0245125 A1 | 11/2006 | Aszmus |
| 2006/0291127 A1 | 12/2006 | Kim et al. |
| 2007/0217106 A1 | 9/2007 | Lagnoux |
| 2008/0043395 A1 | 2/2008 | Donati et al. |
| 2008/0049370 A1 | 2/2008 | Adachi et al. |
| 2009/0302992 A1 | 12/2009 | Cernicka |
| 2011/0013330 A1 | 1/2011 | Crevenat et al. |
| 2011/0193674 A1 | 8/2011 | Zaeuner et al. |
| 2011/0248816 A1 | 10/2011 | Duval et al. |
| 2012/0050935 A1 | 3/2012 | Douglass et al. |
| 2012/0086539 A1 | 4/2012 | Duval et al. |
| 2012/0086540 A1 | 4/2012 | Duval et al. |
| 2012/0206848 A1 | 8/2012 | Gillespie et al. |
| 2012/0250205 A1 | 10/2012 | Pfitzer et al. |
| 2012/0268850 A1 | 10/2012 | Rainer et al. |
| 2013/0200986 A1 | 8/2013 | Koprivsek |
| 2013/0208387 A1 | 8/2013 | Nguyen |
| 2013/0265685 A1 | 10/2013 | Zauner et al. |
| 2013/0335869 A1 | 12/2013 | Xepapas et al. |
| 2014/0010704 A1 | 1/2014 | Ishida et al. |
| 2014/0092514 A1 | 4/2014 | Chen |
| 2014/0292472 A1 | 10/2014 | Qin et al. |
| 2014/0327990 A1 | 11/2014 | Juricev |
| 2015/0014538 A1 | 1/2015 | Holliday |
| 2015/0103462 A1 | 4/2015 | Depping |
| 2015/0107972 A1 | 4/2015 | Oh |
| 2015/0108899 A1 | 4/2015 | Ramabhadran et al. |
| 2015/0270086 A1 | 9/2015 | Chen |
| 2015/0280420 A1 | 10/2015 | Mao |
| 2015/0349523 A1 | 12/2015 | Tsovilis et al. |
| 2016/0087520 A1 | 3/2016 | Falk et al. |
| 2016/0276821 A1* | 9/2016 | Politis .................... H02H 3/00 |
| 2016/0329701 A1 | 11/2016 | Bandel |
| 2017/0311462 A1 | 10/2017 | Kamensek et al. |
| 2018/0138697 A1 | 5/2018 | Crevenat et al. |
| 2018/0138698 A1 | 5/2018 | Tsovilis et al. |
| 2018/0151318 A1 | 5/2018 | Kamensek et al. |
| 2018/0183230 A1 | 6/2018 | Kostakis et al. |
| 2018/0183232 A1 | 6/2018 | Tavcar et al. |
| 2018/0330908 A1 | 11/2018 | Vrhunc et al. |
| 2018/0341024 A1 | 11/2018 | Shetty et al. |
| 2019/0080826 A1 | 3/2019 | Kamensek et al. |
| 2019/0099132 A1 | 4/2019 | Mulinti et al. |
| 2020/0035386 A1* | 1/2020 | Hsu ..................... H01C 1/02 |
| 2020/0036185 A1 | 1/2020 | Tsovilis et al. |

FOREIGN PATENT DOCUMENTS

| | | |
|---|---|---|
| CN | 106026067 A | 10/2016 |
| DE | 1018953 B | 11/1957 |
| DE | 3111096 A1 | 9/1982 |
| DE | 3428258 A1 | 2/1986 |
| DE | 4235329 A1 | 4/1994 |
| DE | 69201021 T2 | 2/1995 |
| DE | 4438593 A1 | 5/1996 |
| DE | 19823446 A1 | 11/1999 |
| DE | 19839422 A1 | 3/2000 |
| DE | 19843519 A1 | 4/2000 |
| DE | 202004006227 U1 | 9/2004 |
| DE | 10323220 A1 | 12/2004 |
| DE | 102005048003 A1 | 4/2007 |
| DE | 102006003274 A1 | 7/2007 |
| DE | 202008004699 U1 | 6/2008 |
| DE | 102007014336 A1 | 10/2008 |
| DE | 102007030653 A1 | 2/2009 |
| DE | 102008017423 A1 | 10/2009 |

(56) References Cited

FOREIGN PATENT DOCUMENTS

| | | | |
|---|---|---|---|
| DE | 102008026555 A1 | 12/2009 | |
| DE | 102009004704 A1 | 3/2010 | |
| DE | 102012004678 A1 | 9/2013 | |
| DE | 202006021210 U1 | 9/2013 | |
| DE | 102013103753 A1 | 10/2013 | |
| DE | 102013011216 B3 | 10/2014 | |
| DE | 102013107807 B3 | 1/2015 | |
| DE | 102013021936 B3 | 2/2015 | |
| DE | 102014016938 B3 | 2/2016 | |
| DE | 102014016830 A1 | 3/2016 | |
| DE | 102007014336 B4 * | 9/2018 | ........... H01H 37/761 |
| EP | 0108518 A2 | 5/1984 | |
| EP | 0203737 A2 | 12/1986 | |
| EP | 0335479 A2 | 10/1989 | |
| EP | 0445054 A1 | 9/1991 | |
| EP | 0462694 A2 | 12/1991 | |
| EP | 0516416 A1 | 12/1992 | |
| EP | 0603428 A1 | 6/1994 | |
| EP | 0785625 A2 | 7/1997 | |
| EP | 0963590 A1 | 12/1999 | |
| EP | 1094550 A2 | 4/2001 | |
| EP | 1102371 A1 | 5/2001 | |
| EP | 1116246 A1 | 7/2001 | |
| EP | 1148530 A1 | 10/2001 | |
| EP | 1355327 A2 | 10/2003 | |
| EP | 1458072 A1 | 9/2004 | |
| EP | 1261977 B1 | 8/2005 | |
| EP | 1798742 A1 | 6/2007 | |
| EP | 1855365 A1 | 11/2007 | |
| EP | 2075811 A2 | 7/2009 | |
| EP | 2201654 A1 | 6/2010 | |
| EP | 2419976 A2 | 2/2012 | |
| EP | 2707892 A1 | 3/2014 | |
| EP | 2725588 A1 | 4/2014 | |
| EP | 2953142 A1 | 12/2015 | |
| EP | 2954538 A1 | 12/2015 | |
| EP | 3001525 A1 | 3/2016 | |
| EP | 3240132 A1 | 11/2017 | |
| EP | 3460938 A1 | 3/2019 | |
| EP | 3989379 A1 | 4/2022 | |
| FR | 2574589 A1 | 6/1986 | |
| FR | 2622047 A1 | 4/1989 | |
| FR | 2897231 A1 | 8/2007 | |
| JP | S60187002 A | 9/1985 | |
| JP | S60226103 A | 11/1985 | |
| JP | S60258905 A | 12/1985 | |
| JP | S61198701 A | 9/1986 | |
| JP | H01176687 A | 7/1989 | |
| JP | H05176445 A | 7/1993 | |
| JP | H09326546 A | 12/1997 | |
| JP | 2002525861 A | 8/2002 | |
| JP | 2002525862 A | 8/2002 | |
| JP | 2005294459 A * | 10/2005 | |
| JP | 2012204473 A * | 10/2012 | |
| JP | 5493065 B2 | 3/2014 | |
| SI | 9700277 A | 4/1999 | |
| SI | 9700332 A | 6/1999 | |
| SI | 20781 A | 6/2002 | |
| SI | 20782 A | 6/2002 | |
| SI | 22030 A | 10/2006 | |
| SI | 23303 A | 8/2011 | |
| SI | 23749 A | 11/2012 | |
| SI | 24371 A | 11/2014 | |
| WO | 8800603 A2 | 1/1988 | |
| WO | 9005401 A1 | 5/1990 | |
| WO | 9515600 A1 | 6/1995 | |
| WO | 9524756 A1 | 9/1995 | |
| WO | 9742693 A1 | 11/1997 | |
| WO | 9838653 A1 | 9/1998 | |
| WO | 0017892 A1 | 3/2000 | |
| WO | 2007117163 A1 | 10/2007 | |
| WO | 2008009507 A1 | 1/2008 | |
| WO | 2008104824 A1 | 9/2008 | |
| WO | 2010120834 A2 | 10/2010 | |
| WO | 2011102811 A2 | 8/2011 | |
| WO | 2012026888 A1 | 3/2012 | |
| WO | 2012154134 A1 | 11/2012 | |
| WO | 2013044961 A1 | 4/2013 | |
| WO | 2016101776 A1 | 6/2016 | |
| WO | 2016110360 A1 | 7/2016 | |

OTHER PUBLICATIONS

Machine translation of Otsuki et al. Japanese Patent Document JP 2005-294459 A Oct. 2005 (Year: 2005).*
Machine translation of Kimoto et al. Japanese Patent Document JP 2012-204473 A Oct. 2012 (Year: 2012).*
Data Book Library 1997 Passive Components, Siemens Matsushita Components (pp. 15-17, 26-32, 36-37, 39, 161, 166, 167, 169, 171-174) (1997).
FormexTM GK/Formex Product Data Flame Retardant Polypropylene Sheet, ITW Formex (4 pages) (2002).
Raycap "RayvossTM Transient Voltage Surge Suppression System" webpage <http://www.raycap.com/surge/rayvoss.htm> (1 page) (undated, accessed on Nov. 29, 2005) (Date Unknown; Admitted Prior Art).
Translation of DIN-Standards, Built-In Equipment for Electrical Installations; Overall Dimensions and Related Mounting Dimensions (15 pages) (Dec. 1988).
VAL-MS-T1/T2 335/12.5/3+1, Extract from the online catalog, Phoenix Contact GmbH & Co. KG, http://catalog.phoenixcontact.net/phoenix/treeViewClick.do?UID=2800184 (7 pages) (May 22, 2014).
Beitz, W., et al., "Chapter 1: Mechanical Design Elements—Component Connections", in Dubbel Taschenbuch für den Maschinenbau. Springer, Germany, 1997, G24-G25.
DuPont, "DuPont 4300 Series Resistors", Technical Data Sheet, May 2013, (3 pages).
Oberg, Erik, et al., "Soldering and Brazing", Machinery's Handbook 27th Edition. McCauley, C. J., Heald, R. L., and Hussain, M. I. (Eds.). Industrial Press Inc., New York, NY, 2004, 1380-1382.
Raycap, "Revolutionary Lightning Protection Technology", Raycap Corporation Press Release, webpage, http://www.raycap.com/news/020930.htm accessed on Nov. 29, 2005 (Date Unknown; Admitted Prior Art), (1 page).
Raycap, "Strikesorb® 30 Series OEM Surge Suppression Solutions", brochure, Apr. 17, 2009, (2 pages).
Raycap, "The Next Generation Surge Protection Rayvoss™", brochure, May 4, 2012, (4 pages).
Raycap, "The Ultimate Overvoltage Protection Rayvoss™", brochure, 2005, (4 pages).
Raycap, "The Ultimate Overvoltage Protection Rayvoss™", brochure, Jan. 2009, (4 pages).
Raycap, "The Ultimate Overvoltage Protection: RayvossTM", brochure (Date Unknown; Admitted Prior Art), (4 pages).
RayvossTM, "Applications", webpage http://www.rayvoss.com/applications.htm accessed on Nov. 29, 2005 (Date Unknown; Admitted Prior Art), (4 pages).
RayvossTM, "Frequently Asked Questions", webpage, http://www.rayvoss.com/faq.htm accessed on Nov. 29, 2005 (Date Unknown; Admitted Prior Art), (2 pages).
RayvossTM, "Technical Information", webpage, http://www.rayvoss.com/tech_info.htm accessed on Nov. 29, 2005 (Date Unknown; Admitted Prior Art), (3 pages).
RayvossTM, "The Ultimate Overvoltage Protection", webpage, http://www.rayvoss.com accessed on Nov. 29, 2005 (Date Unknown; Admitted Prior Art), (2 pages).
Extended European Search Report corresponding to European Patent Application No. 23203955.5 (8 pages) (dated Mar. 19, 2024).

* cited by examiner

SURGE PROTECTIVE DEVICES

RELATED APPLICATION(S)

The present application claims the benefit of and priority from U.S. Provisional Patent Application No. 63/380,048, filed Oct. 18, 2022, the disclosure of which is incorporated herein by reference.

FIELD

The present invention relates to surge protective devices (SPDs).

BACKGROUND

Many applications generate temporary overvoltages with high energy during switching operations or faults in an electrical power network. These excessive energies must be absorbed with a device without creating high residual voltages on the equipment or load.

To meet the above requirements, one or more metal oxide varistors (i.e., voltage dependent resistors) are used to absorb the electric energy during transient events and to keep the voltage to desired low values. The varistor has a characteristic clamping voltage such that, responsive to a voltage increase beyond a prescribed voltage, the varistor forms a low resistance shunt path for the overvoltage current that reduces the potential for damage to the sensitive equipment.

Varistors have been constructed according to several designs for different applications. For heavy-duty applications (e.g., surge current capability in the range of from about 60 to 100 kA) such as protection of telecommunications facilities, block varistors are commonly employed. A block varistor typically includes a disk-shaped varistor element potted in a plastic housing. The varistor disk is formed by pressure casting a metal oxide material, such as zinc oxide, or other suitable material such as silicon carbide. Copper, or other electrically conductive material, is flame sprayed onto the opposed surfaces of the disk. Ring-shaped electrodes are bonded to the coated opposed surfaces and the disk and electrode assembly is enclosed within the plastic housing. Examples of such block varistors include product No. SIOV-B86OK250 available from Siemens Matsushita Components GmbH & Co. KG and Product No. V271 BA60 available from Harris Corporation.

Another varistor design includes a high-energy varistor disk housed in a disk diode case. The diode case has opposed electrode plates and the varistor disk is positioned therebetween. One or both of the electrodes include a spring member disposed between the electrode plate and the varistor disk to hold the varistor disk in place. The spring member or members provide only a relatively small area of contact with the varistor disk.

The varistor constructions described above often perform inadequately in service. Often, the varistors overheat and catch fire. Overheating may cause the electrodes to separate from the varistor disk, causing arcing and further fire hazard. There may be a tendency for pinholing of the varistor disk to occur, in turn causing the varistor to perform outside of its specified range. During high current impulses, varistor disks of the prior art may crack due to piezoelectric effect, thereby degrading performance. Failure of such varistors has led to new governmental regulations for minimum performance specifications. Manufacturers of varistors have found these new regulations difficult to meet.

SUMMARY

According to some embodiments, a surge protective device (SPD) module includes a printed circuit board (PCB), a first electrode, a second electrode, and a varistor electrically connected between the first and second electrodes. The SPD module forms a housing assembly defining a chamber containing the varistor. The PCB forms a portion of the housing assembly.

According to some embodiments, the first electrode is a housing electrode defining a cavity and a housing electrode opening communicating with the cavity, the varistor is contained in the cavity, and the PCB closes the housing electrode opening to enclose the chamber.

In some embodiments, the second electrode is a piston electrode extending into the cavity, and the varistor is disposed in the cavity between the housing electrode and the piston electrode.

In some embodiments, the PCB includes a hole defined therein, and an integral terminal post of the piston electrode extends through the hole.

According to some embodiments, the SPD module includes a varistor stack including a stack of varistor members. The varistor stack is electrically connected between the second electrode and the housing electrode. The varistor stack includes at least one electrically conductive interconnect member connecting at least two of the varistor members in electrical parallel between the second electrode and the housing electrode. The SPD module includes a spacer formed of an electrically insulating material. The spacer includes a receiver recess. A portion of the interconnect member extends outwardly beyond the plurality of varistor members and is disposed in the receiver recess.

In some embodiments, the SPD module includes an integral fail-safe mechanism including an electrically conductive, meltable member. The meltable member is responsive to heat in the SPD module to melt and form a short circuit current flow path through the meltable member, between the second electrode and the housing electrode and bypassing the varistor.

According to some embodiments, the housing electrode is electrically connected to an electrically conductive trace of the PCB.

In some embodiments, the SPD module includes an electrically conductive fastener securing the PCB to the housing electrode, and the housing electrode is electrically connected to the electrically conductive trace of the PCB through the electrically conductive fastener.

In some embodiments, the electrically conductive trace is a ground plane of the PCB.

In some embodiments, the second electrode is electrically connected to a second electrically conductive trace of the PCB.

In some embodiments, the PCB includes an integral first terminal electrically connected to the first electrically conductive trace, and an integral second terminal electrically connected to the second electrically conductive trace.

According to some embodiments, the SPD module includes an elastomeric gasket member that is maintained in an elastically compressed state by the PCB to seal the chamber.

According to some embodiments, the PCB includes a first PCB section and a second PCB section, and the SPD module further includes: a third electrode; and a second varistor electrically connected between the third electrode and the first electrode. The SPD module forms a second chamber containing the second varistor. The SPD module includes: an integral first SPD subassembly including the first and second electrodes, the first varistor, and the first PCB section; and an integral second SPD subassembly including the first and third electrodes, the second varistor, and the second PCB section.

According to some embodiments, the SPD module includes a second PCB, a third electrode, and a second varistor electrically connected between the third electrode and the first electrode. The SPD module forms a second chamber containing the second varistor. The SPD module includes: an integral first SPD subassembly including the first and second electrodes, the first varistor, and the first PCB; and an integral second SPD subassembly including the first and third electrodes, the second varistor, and the second PCB.

According to some embodiments, the PCB includes a first PCB section and a second PCB section. The SPD module further includes a third electrode, a fourth electrode, and a second varistor electrically connected between the third and fourth electrodes. The SPD module forms a second housing assembly defining a second chamber containing the second varistor. The first PCB section forms a portion of the first housing assembly. The second PCB section forms a portion of the second housing assembly.

According to some embodiments, a printed circuit board assembly includes a printed circuit board (PCB), and a surge protective device (SPD) subassembly mounted on the PCB. The SPD subassembly includes: a first electrode; a second electrode; a varistor electrically connected between the first and second electrodes. The first electrode and the PCB each form parts of a housing assembly defining a chamber containing the varistor.

According to some embodiments, a power supply circuit includes a surge protective device (SPD) module, a first electrical line a first electrical potential, and a second electrical line a second electrical potential. The SPD module includes a printed circuit board (PCB), a first electrode, a second electrode, and a varistor electrically connected between the first and second electrodes. The SPD module forms a housing assembly defining a chamber containing the varistor. The PCB forms a portion of the housing assembly. The first electrical line is connected to the first electrode. The second electrical line is connected to the second electrode.

In some embodiments, the power supply circuit includes a remote monitoring device, a first remote monitor line connected to the first electrode through the PCB, and a second remote monitor line connected to the second electrode through the PCB.

BRIEF DESCRIPTION OF THE DRAWINGS

The accompanying drawings, which form a part of the specification, illustrate embodiments of the present invention.

DETAILED DESCRIPTION OF EMBODIMENTS

Figure 1:
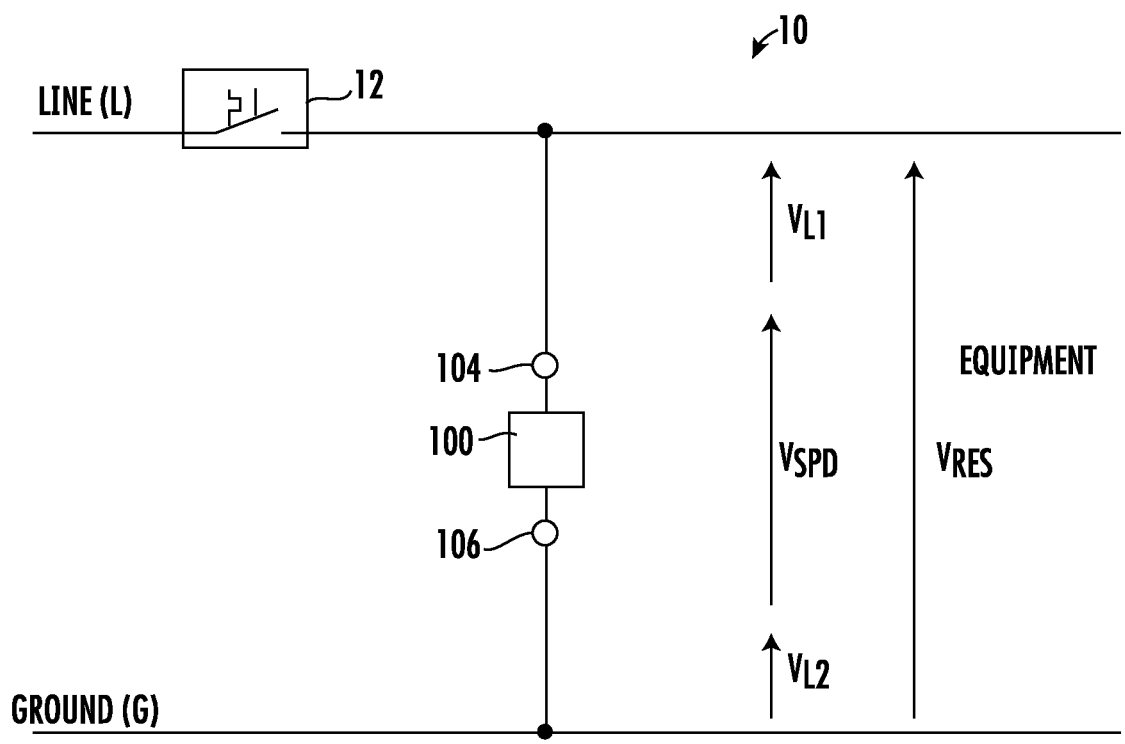
FIG. 1 is a block diagram that illustrates an electrical power supply circuit including a surge protective device (SPD) module in accordance with some embodiments.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It is noted that aspects described with respect to one embodiment may be incorporated in different embodiments although not specifically described relative thereto. That is, all embodiments and/or features of any embodiments can be implemented separately or combined in any way and/or combination. Moreover, other apparatus, methods, and systems according to embodiments of the inventive concept will be or become apparent to one with skill in the art upon review of the following drawings and detailed description. It is intended that all such additional apparatus, methods, and/or systems be included within this description, be within the scope of the present inventive subject matter, and be protected by the accompanying claims.

As used herein, "monolithic" means an object that is a single, unitary piece formed or composed of a material without joints or seams. Alternatively, a unitary object can be a composition composed of multiple parts or components secured together at joints or seams.

As used herein, the term "wafer" means a substrate having a thickness which is relatively small compared to its diameter, length or width dimensions.

With reference to FIGS. 1-14, a modular surge protective device according to embodiments of the present invention is shown therein and designated 100.

In some embodiments, the SPD module 100 is provided, installed and used as a component in a protection circuit of a power supply circuit 10 as shown in FIG. 1, for example. In the power supply circuit 10, the SPD module 100 is connected between a power supply Line and electrical Ground across sensitive equipment. The fused SPD module 100 is designed to protect the sensitive equipment from overvoltages and current surges. The fused SPD module 100 may also be connected to the power source via an upstream second fuse or circuit breaker 12.

Figure 4:
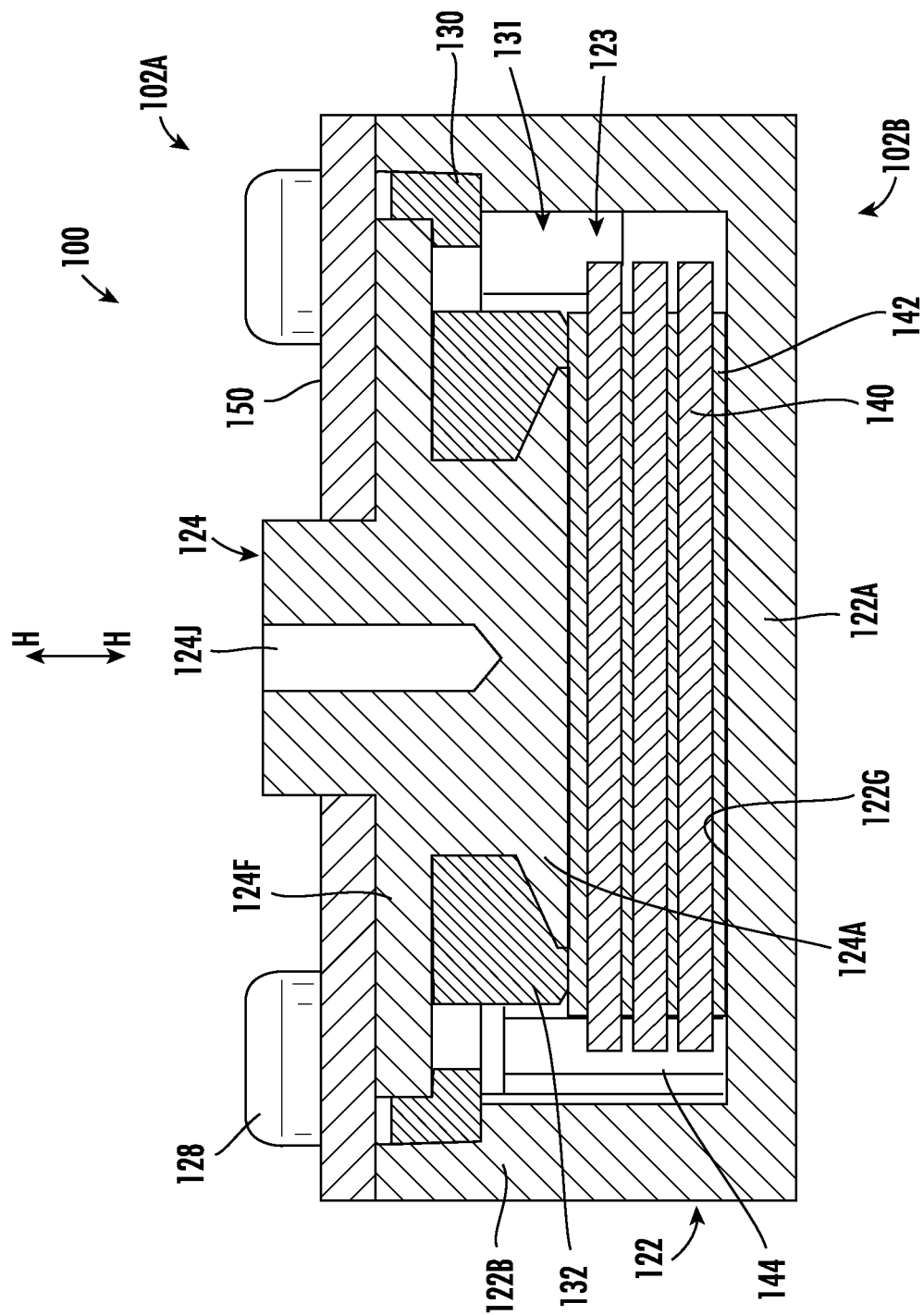
FIG. 4 is a cross-sectional view of the SPD module of FIG. 1 taken along the line 4-4 of FIG. 2.
Figure 5:
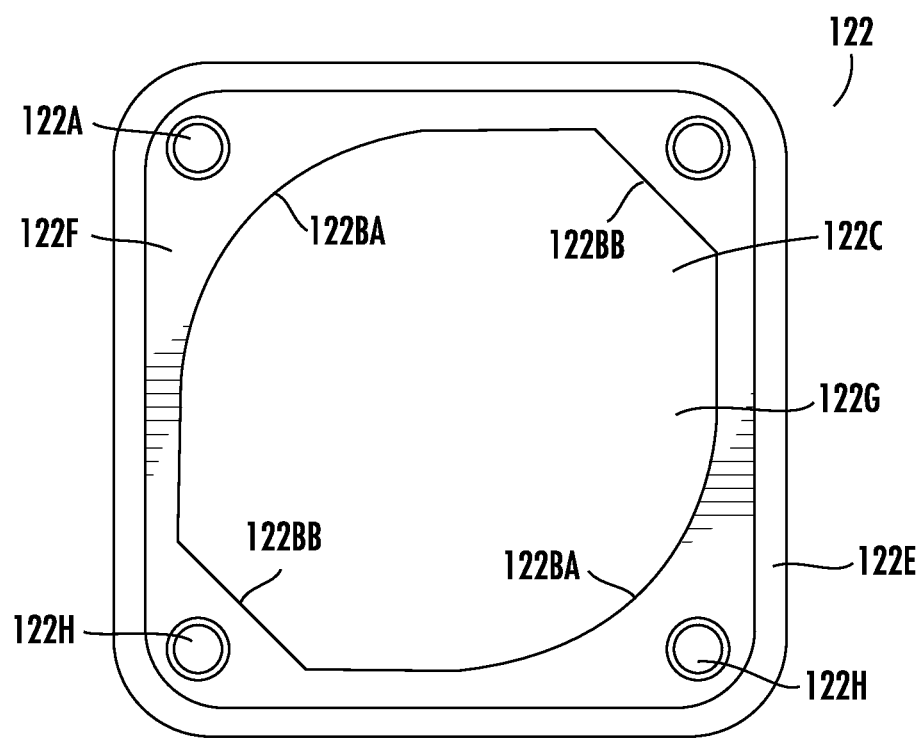
FIG. 5 is a top view of a housing electrode of the SPD module of FIG. 1.
Figure 6:
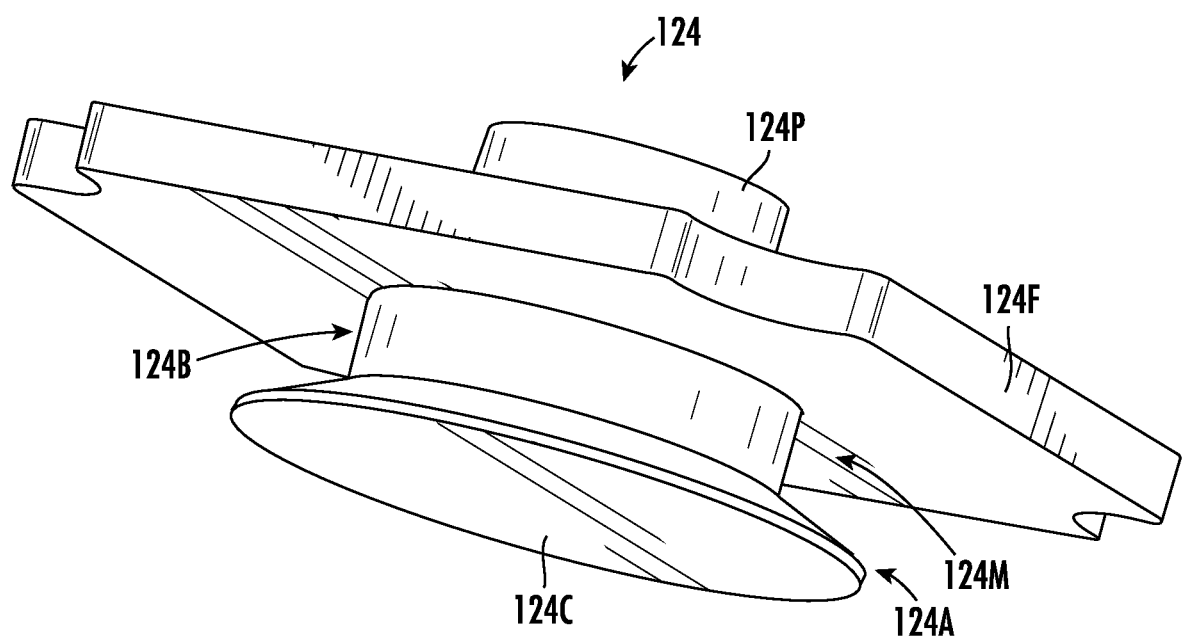
FIG. 6 is a bottom perspective view of a piston electrode of the SPD module of FIG. 1.
Figure 7:
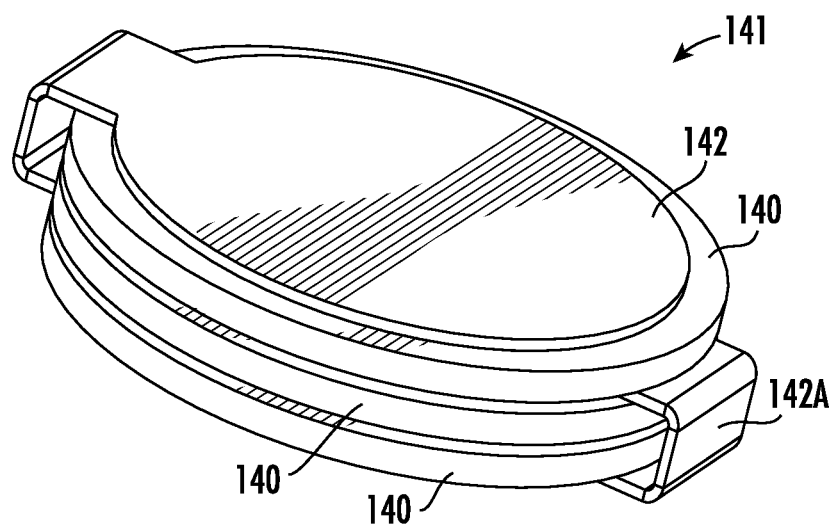
FIG. 7 is a top perspective view of a varistor stack of the SPD module of FIG. 1.
Figure 8:
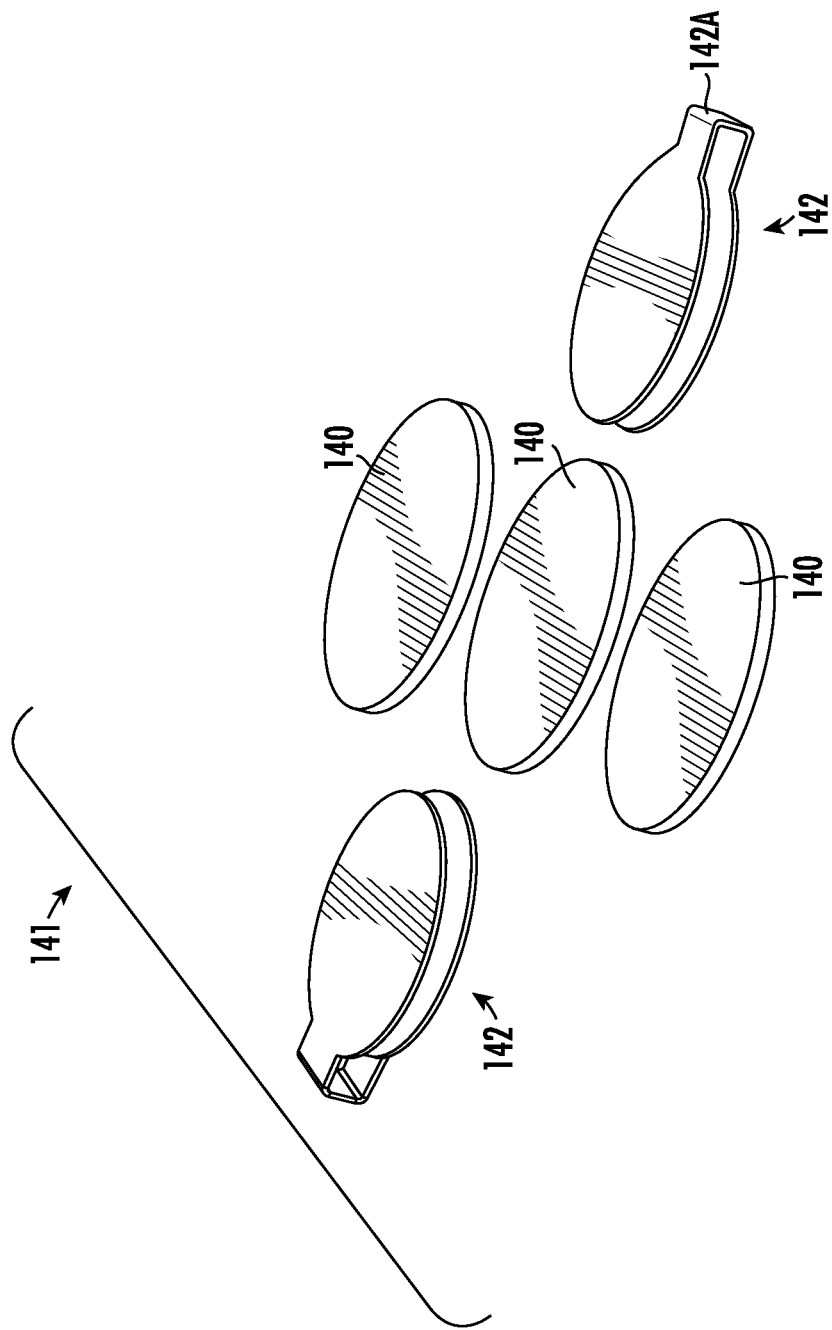
FIG. 8 is an exploded, top perspective view of the varistor stack of FIG. 7.

The SPD module 100 is configured as a unit or module having a lengthwise axis H-H (FIG. 4). The SPD module 100 has a first end 102A and an opposing second end 102B. The ends 102A and 102B and other features are referred to herein as "top", "bottom", "upper" or "lower" only for the purpose of explanation. It will be appreciated that the SPD module 100 can assume any orientation and therefore these features are not limited to any such top/bottom or upper/lower relationship.

Figure 2:
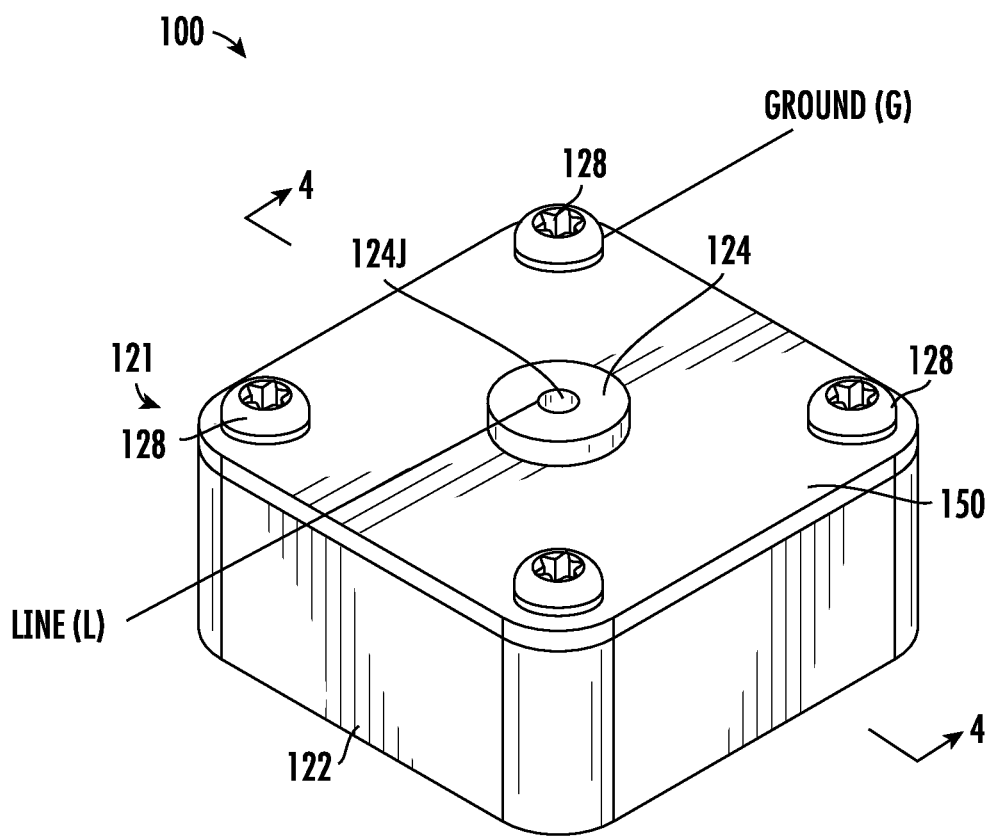
FIG. 2 is a top perspective view of the SPD module of FIG. 1.
Figure 3:
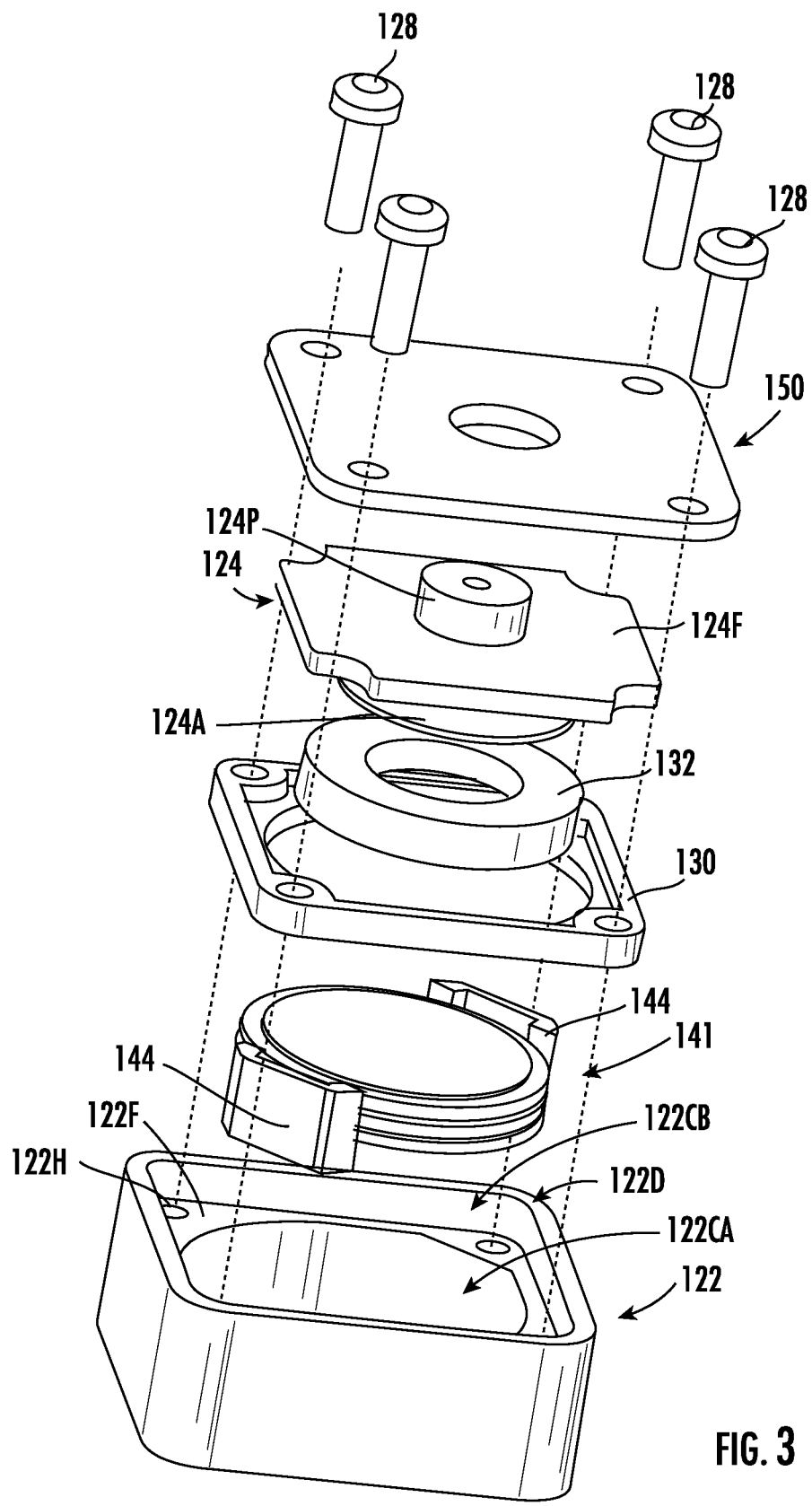
FIG. 3 is an exploded, top perspective view of the SPD module of FIG. 1.

With reference to FIGS. 2-4, the SPD module 100 includes a housing assembly 121, a varistor stack 141 (including one or more varistor members or wafers 140), a pair of electrical insulator spacers 144, an integral fail-safe mechanism 131 (including a meltable member 132).

The fail-safe mechanism 131 (FIG. 4) is adapted to prevent or inhibit overheating or thermal runaway of the overvoltage protection device, as discussed in more detail below.

The module housing assembly 121 includes and is collectively formed by an outer or housing electrode 122, an inner or piston electrode 124, end cap fasteners (screws) 128, an elastomeric insulator or gasket 130, and an integrated end cap 150. The housing electrode 122 serves as a second electrode opposite the inner electrode 124. The module housing assembly 121 defines an environmentally sealed, enclosed SPD chamber 123. The varistor stack 141, the electrical insulator spacers 144, and the meltable member 132 are contained in the sealed chamber 123. The compressed gasket 132 forms a fluid-tight seal between the electrodes 122, 124.

The housing electrode 122 (FIG. 5) has an end electrode wall 122A and an integral tubular sidewall 122B extending from the electrode wall 122A. The electrode wall 122A has an inwardly facing, substantially planar contact surface 122G. The sidewall 122B has an annular, substantially planar end face 122E.

The sidewall 122B and the electrode wall 122A form a two-step electrode chamber 122C including a first or inner subchamber or cavity 122CA, and a second or outer subchamber or cavity 122CB located between the subchamber 122CA and the opening 122D and contiguous with the opening 122D. An annular landing or flange 122F is located between the subchambers 122CA, 122CB. The outer subchamber 122CB forms a rectangular parallelepiped space with rounded edges and receives the gasket 132 and a portion of the piston electrode 124. Threaded fastener holes 122H are provided in the corners of the flange 122F.

The inner subchamber 122CA has internally a semi-oval side wall which consists of cylindrical wall sections 122BA and flat wall sections 122BB to fit the insulating spacers 144. The inner subchamber 122CA receives the varistor stack 141, the meltable member 132, the spacers 144, and a portion of the piston electrode 124.

According to some embodiments, the housing electrode 122 is formed of aluminum. However, any suitable electrically conductive metal may be used. According to some embodiments, the housing electrode 122 is unitary and, in some embodiments, monolithic. The housing electrode 122 as illustrated is rectangular shaped but may be shaped differently.

The inner electrode 124 (FIG. 6) has a head 124A disposed in the subchamber 122CA and an integral shaft 124B that projects outwardly through the opening 122D.

The head 124A has a substantially planar contact surface 124C that faces the contact surface 122G of the electrode wall 122A. An integral, annular flange 124F extends radially outwardly from the shaft 124B and with the head 124A defines an annular, sidewardly opening groove 124M therebetween. A neck or post 124P extends from the shaft 124B above the flange 124F and has a smaller diameter than the flange 124F. A threaded bore 124J is formed in the end of the post 124P to receive a bolt for securing the electrode 124 to a cable or busbar, for example.

According to some embodiments, the inner electrode 124 is formed of aluminum. However, any suitable electrically conductive metal may be used. According to some embodiments, the inner electrode 124 is unitary and, in some embodiments, monolithic.

An annular gap is defined radially between the head 124A or the cylindrical sidewall of the meltable member 132, whichever has greater outer diameter, and the nearest adjacent surface of the sidewall 122B. According to some embodiments, the gap has a radial width in the range of from about 1 to 10 mm.

The meltable member 132 is annular and is mounted on the inner electrode 124 in the groove 124M in the subchamber 122CB. The meltable member 132 is spaced apart from the sidewall 122B a distance sufficient to electrically isolate the meltable member 132 from the sidewall 122B.

The meltable member 132 is annular and surrounds the intermediate shaft portion between the head 124A and the flange 124F, which is disposed in a central passage of the meltable member 132. In some embodiments and as shown, the meltable member 132 is a cylindrical, tubular piece or sleeve. According to some embodiments, the meltable member 132 contacts the intermediate shaft portion and, according to some embodiments, the meltable member 132 contacts the intermediate shaft portion along substantially the full length of the intermediate shaft portion and the full length of the meltable member 132. The meltable member 132 is spaced apart from the semi-oval sidewall 122B of the housing electrode 122 a distance sufficient to electrically isolate the meltable member 132 from the sidewall 122B.

The meltable member 132 is formed of a heat-meltable, electrically conductive material. According to some embodiments, the meltable member 132 is formed of metal. According to some embodiments, the meltable member 132 is formed of an electrically conductive metal alloy. According to some embodiments, the meltable member 132 is formed of a metal alloy from the group consisting of aluminum alloy, Zinc alloy, and/or tin alloy. However, any suitable electrically conductive metal may be used.

According to some embodiments, the meltable member 132 is selected such that its melting point is greater than a prescribed maximum standard operating temperature. The maximum standard operating temperature may be the greatest temperature expected in the meltable member 132 during normal operation (including handling overvoltage surges within the designed for range of the device 100) but not during operation which, if left unchecked, would result in thermal runaway. According to some embodiments, the meltable member 132 is formed of a material having a melting point in the range of from about 80 to 160° C. and, according to some embodiments, in the range of from about 80 to 120° C. According to some embodiments, the melting point of the meltable member 132 is at least 20° C. less than the melting points of the housing electrode 122 and the electrode 124 and, according to some embodiments, at least 40° C. less than the melting points of those components.

According to some embodiments, the meltable member 132 has an electrical conductivity in the range of from about $0.5 \times 10^6$ Siemens/meter (S/m) to $4 \times 10^7$ S/m and, according to some embodiments, in the range of from about $1 \times 10^6$ S/m to $3 \times 10^6$ S/m.

The meltable member 132 can be mounted on the electrode 124 in any suitable manner. According to some embodiments, the meltable member 132 is cast or molded onto the electrode 124. According to some embodiments, the meltable member 132 is mechanically secured onto the electrode 124. According to some embodiments, the meltable member 132 is unitary and, in some embodiments, monolithic.

The varistor stack 141 (FIGS. 7 and 8) includes a plurality of varistor members or wafers 140 and a plurality of internal parallelization plates or interconnect members 142. The varistor members 140 and the interconnect members 142 are axially stacked in the inner subchamber 122CA between the electrode head 124A and the electrode end wall 122A and form the varistor stack 141. The varistor members 140 and the interconnect members 142 are axially aligned along a varistor stack axis, which may be parallel or coaxial with the SPD module axis H-H. The interconnect members 142 electrically interconnect the varistor members 140 and the electrodes 122, 124. The varistor stack 141 may connect the varistor 140 thereof in electrical series or parallel.

Figure 9:
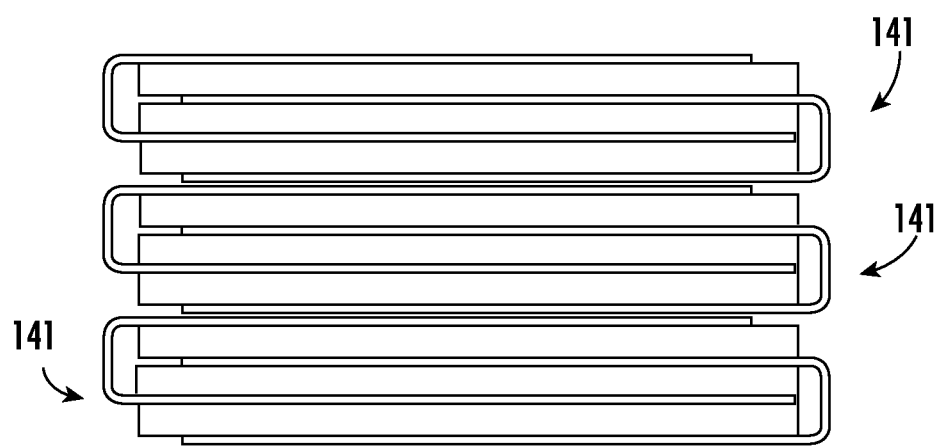
FIG. 9 is a side view of a varistor stack according to an alternative embodiment.
Figure 10:
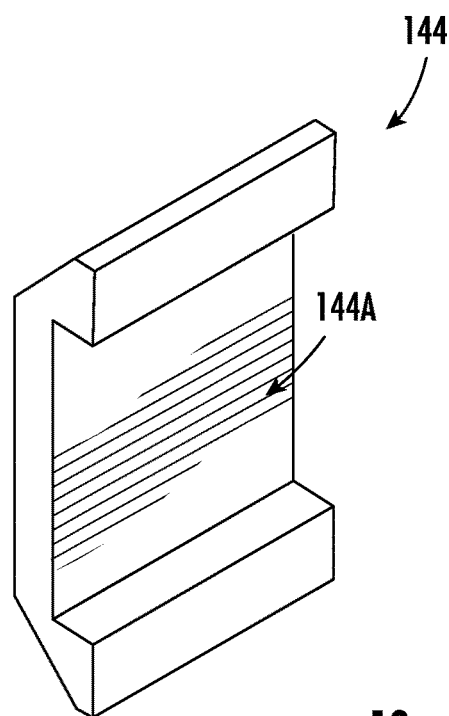
FIG. 10 is a perspective view of a spacer of the SPD module of FIG. 1.
Figure 11:
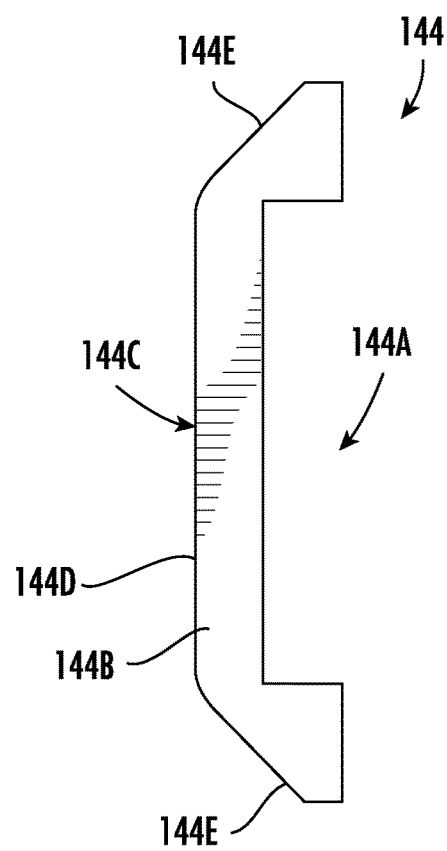
FIG. 11 is a top view of the spacer of FIG. 10.
Figure 12:
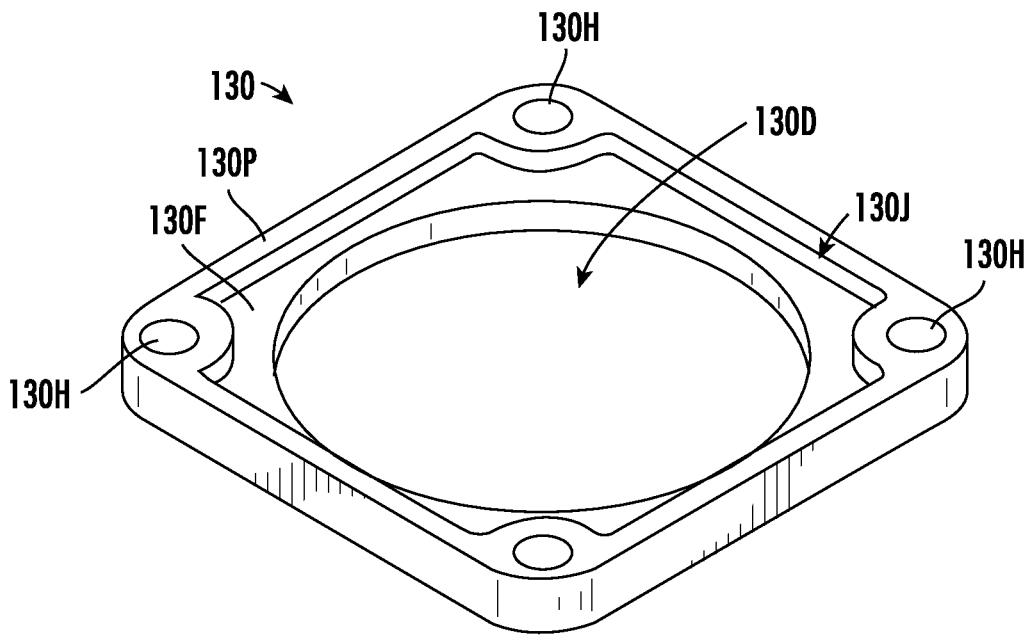
FIG. 12 is top perspective view of a gasket of the SPD module of FIG. 1.
Figure 13:
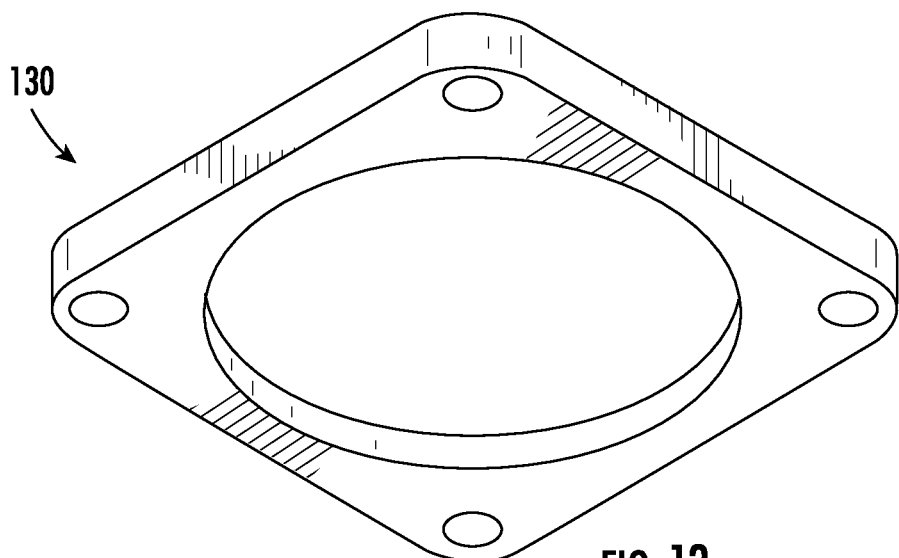
FIG. 13 is a bottom perspective view of the gasket of FIG. 12.
Figure 14:
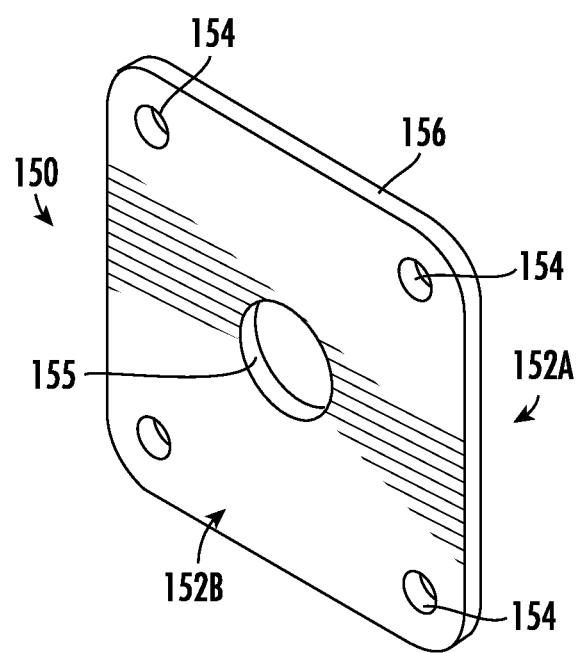
FIG. 14 is a top view of a PCB end cap of the SPD module of FIG. 1.

FIG. 9 shows an alternative arrangement wherein a plurality of the parallelized varistor stacks 141 are stacked in electrical series to form a multi-stack. This multi-stack may be installed between the electrodes 122, 124 in place of a single varistor stack 141.

According to some embodiments, each varistor member 140 is a varistor wafer (i.e., is wafer- or disk-shaped). In some embodiments, each varistor wafer 140 is circular in shape and has a substantially uniform thickness. However, varistor wafers 140 may be formed in other shapes. The thickness and the diameter of the varistor wafers 140 will depend on the varistor characteristics desired for the particular application.

The varistor material may be any suitable material conventionally used for varistors, namely, a material exhibiting a nonlinear resistance characteristic with applied voltage. In some embodiments, the varistors 140 are metal oxide varistors (MOVs). Preferably, the resistance becomes very low when a prescribed voltage is exceeded. The varistor material may be a doped metal oxide or silicon carbide, for example. Suitable metal oxides include zinc oxide compounds.

The insulating bodies or spacers 144 (FIG. 11) are used to fix in place the varistor stack 141, to provide appropriate electrical insulation of the varistor stack 141 from the flat walls 122BB of housing electrode 122, and to provide adequate thermal conductivity. Each spacer 144 includes a slot or recess 144A to receive electrically conductive bridge portions 142A of the interconnect members 142. Each spacer 144 includes two opposed flat end sides 144B (one of which is fixed against the housing electrode end wall 122A). Each spacer 144 also includes a C-shape surface 144C with a central flat wall 144D that is fixed against the housing electrode flat wall 122BB and side flat walls 144E that are fixed against the adjacent side wall sections 122BA of the housing electrode 122.

In some embodiments, the spacers 144 are formed of a ceramic (e.g., Alumina or Zirconia) or a high temperature plastics (e.g., ULTEM™ 1000, KETRON® 1000 PEEK and similar materials).

The gasket 130 (FIGS. 12 and 13) is a unitary, annular member. The gasket 130 is a compression gasket that serves to seal the chamber 123. The gasket 130 includes an upstanding, axially extending peripheral flange 130P, a radially extending inner flange 130F, a central opening 130D, and four fastener holes 130H. The flanges 130P and 130F define a step or recess 130J. The gasket 130 is seated in the outer chamber 122CB. The flange 124F of the piston electrode 124 is seated in the recess 130J.

The gasket 130 is formed of an electrically insulating, resilient, elastomeric material. According to some embodiments, the elastomeric gasket 130 is formed of a material having a hardness in the range of from about 30 Shore A to 90 Shore A. According to some embodiments, the elastomeric gasket 130 is formed of rubber. According to some embodiments, the elastomeric gasket 130 is formed of silicone rubber. Suitable materials for the elastomeric gasket 130 may include silicone rubber having a Shore hardness in the range of from 30 Shore A to 90 Shore A.

The end cap 150 (FIGS. 2-4 and 14) is a rigid member. The end cap 150 has an inner side or face 152A and an outer side or face 152B. The end cap 150 includes a fastener hole 154 at each corner and a centrally located electrode post hole 155.

The end cap 150 may be formed of any suitable electrically insulating material(s). The materials used for the end cap 150 may include ceramics (for example, Alumina, Zirconia) or high temperature plastics (for example, ULTEM™ 1000, KETRON® 1000 PEEK or FR-4 or PTFE (Teflon)) and similar materials.

In some embodiments, the end cap 150 is a printed circuit board (PCB) or a portion of a PCB. In this case, the PCB end cap 150 provides the mechanical and electrical insulation functions of the end cap 150 and can enable the SPD 100 to be integrated into a PCB assembly including the PCB end cap 150.

The PCB end cap 150 includes an electrically insulating PCB substrate 156 and a plurality or pattern(s) of electrically conductive (e.g., copper) layers laminated to the substrate and embodied in the PCB end cap 150, as is well known in the art. These electrically conductive layers may include electrically conductive traces, pads, vias, and/or plated through-holes, for example. The PCB substrate 156 may be formed of any suitable rigid, electrically insulating material, such as giberglass FR1, fiberglass FR4, epoxies, and glass epoxies (such as CEM-1, G11), or polytetrafluoroethylene (PTFE).

In some embodiments, at least a portion of an electrical circuit is embodied in the PCB end cap 150 on the PCB substrate 156. In some embodiments, the electrical circuit is entirely embodied in the PCB end cap 150. The electrical circuit may include various electrical components and connections (e.g., electrical traces, etc.) that are formed in or mounted on the PCB end cap 150, as is well known in the art.

In some embodiments, electronic components (in addition to the components of the SPD 100) are mounted on and electrically connected to or integrated with the PCB end cap 150, in which case the PCB end cap 150 and the electronic components in combination constitute a PCB assembly. In some embodiments, no electronic components are mounted on and electrically connected to or integrated with the PCB end cap 150.

The end cap fasteners 128 may be any suitable type of fastener. In some embodiments, the fasteners 128 are threaded fasteners and, in some embodiments, are screws. Screws of any of the known or suitable drive design (e.g., Slotted, Phillips, Hexagonal, Torx etc.) may be used.

The varistor stack 141, the spacers 144 and the piston electrode 124 are seated in the chamber 122CA. The gasket 130 is seated in the chamber 122CB. The varistor stack is axially stacked between the electrode end wall 122A and the head 124A and in electrical contact with the contact surfaces 122G, 124G. The gasket flange 130F is axially interposed or sandwiched between the electrode flange 124F and the electrode flange 122F. The end cap 150 is place over the opening 122D such that the electrode post 124P extends through the hole 155 and the peripheral edge portions of the end cap 150 mate with the electrode end face 122E. The end cap fasteners 128 are inserted through the aligned holes 154, 130H and threaded into the holes 122H. The fasteners 128 are tightened to clamp the piston electrode 124 between the end cap 150 and the electrode end wall 122A.

The force applied to the electrode 124 is in turn applied to the varistor stack 141 so that the contact surfaces 122G, 124G maintain firm and reliable electrical contact with the varistor stack 141.

Also, the force applied to the electrode 124 is in turn applied to the elastomeric gasket 130. This causes the gasket 130 to elastically deform and form a tight, persistent, fluid-tight environmental seal between the electrodes 122, 124, which seals the chamber 123. The resilience or bias of the gasket 130 tends to push piston electrode 124 away from the varistor stack 141, but this effect is adequately counteracted by the clamping arrangement between the end cap 150 and the electrodes 122, 124.

According to some embodiments, the clamping load on the piston electrode 124 by the end cap 150 and the housing electrodes 122 is in the range of from 1 N and 500 kN.

The upstanding gasket flange 130P surrounds piston electrode flange 124F to insulate the piston electrode 124 from the electrode sidewall 122B. The inner gasket flange 130F insulates inner face of the piston flange 124F from the flange 122F of the housing electrode 122. Because the end cap 150 is electrically insulating, the post 124P is likewise electrically isolated from the housing electrode 122.

The spacers 144 maintain the varistor stack 141 in proper position relative to the electrodes 122, 124 during assembly of the SPD module 100. In some embodiments, when formed from ceramic, the spacers 144 act as aggregates during short circuit end of life of the SPD module 100.

In some embodiments and with reference to FIG. 1, the terminal 104 is electrically connected to the Line (L) of the circuit 10, and the terminal 106 is electrically connected to the Ground (G) of the circuit 10. It will be appreciated that the connections may be reversed. In some embodiments, a conductor from the Line (L) is terminated on the post 124P to connect the Line (L) to the piston electrode 124, and a conductor from the Ground (G) is terminated at one of the screws 128 to connect the Ground (G) to the housing electrode 122. In this case, the post 124P serves as a first electrical terminal and the screw 128 serves as a second electrical terminal of the SPD module 100.

In the assembled SPD module 100, the mating large, planar contact surfaces 122A, 124A of the electrodes 122, 124 and the varistor stack 141 can ensure reliable and consistent electrical contact and connection between the components during an overvoltage or surge current event. In some embodiments, the head 124A and the end wall 122A are mechanically loaded against the varistor stack 141 to ensure firm and uniform engagement between the mating contact surfaces.

The meltable member 132 and the electrodes 122, 124 are relatively constructed and configured to form the fail-safe system 131. The fail-safe system 131 provides a safe failure mode for the SPD module 100.

During use, one or more of the varistor wafers 140 may be damaged by overheating and may generate arcing inside the SPD housing assembly 121. The SPD housing assembly 121 can contain the damage (e.g., debris, gases and immediate heat) within the SPD module 100, so that the SPD module 100 fails safely. In this way, the SPD module 100 can prevent or reduce any damage to adjacent equipment (e.g., switch gear equipment in the cabinet) and harm to personnel. In this manner, the SPD module 100 can enhance the safety of equipment and personnel.

Additionally, the SPD module 100 provides a fail-safe mechanism in response to end of life mode in the varistor wafers 140. In case of a failure of a varistor wafer, a fault current will be conducted between the corresponding line and the neutral line. As is well known, a varistor has an innate nominal clamping voltage VNOM (sometimes referred to as the "breakdown voltage" or simply the "varistor voltage") at which the varistor begins to conduct current. Below the VNOM, the varistor will not pass current. Above the VNOM, the varistor will conduct a current (i.e., a leakage current or a surge current). The VNOM of a varistor is typically specified as the measured voltage across the varistor with a DC current of 1 mA.

As is known, a varistor has three modes of operation. In a first normal mode (discussed above), up to a nominal voltage, the varistor is practically an electrical insulator. In a second normal mode (also discussed above), when the varistor is subjected to an overvoltage, the varistor temporarily and reversibly becomes an electrical conductor during the overvoltage condition and returns to the first mode thereafter. In a third mode (the so-called end of life mode), the varistor is effectively depleted and becomes a permanent, non-reversible electrical conductor.

The varistor also has an innate clamping voltage VC (sometimes referred to as simply the "clamping voltage"). The clamping voltage VC is defined as the maximum voltage measured across the varistor when a specified current is applied to the varistor over time according to a standard protocol.

In the absence of an overvoltage condition, the varistor wafer 140 provides high resistance such that no current flows through the SPD module 100 as it appears electrically as an open circuit. That is, ordinarily the varistor passes no current. In the event of an overcurrent surge event (typically transient; e.g., lightning strike) or an overvoltage condition or event (typically longer in duration than an overcurrent surge event) exceeding VNOM, the resistance of the varistor wafer decreases rapidly, allowing current to flow through the SPD module 100 and create a shunt path for current flow to protect other components of an associated electrical system. Normally, the varistor recovers from these events without significant overheating of the SPD module 100.

Varistors have multiple failure modes. The failure modes include: 1) the varistor fails as a short circuit; and 2) the varistor fails as a linear resistance. The failure of the varistor to a short circuit or to a linear resistance may be caused by the conduction of a single or multiple surge currents of sufficient magnitude and duration or by a single or multiple continuous overvoltage events that will drive a sufficient current through the varistor.

A short circuit failure typically manifests as a localized pinhole or puncture site (herein, "the failure site") extending through the thickness of the varistor. This failure site creates a path for current flow between the two electrodes of a low resistance, but high enough to generate ohmic losses and cause overheating of the device even at low fault currents. Sufficiently large fault current through the varistor can melt the varistor in the region of the failure site and generate an electric arc.

A varistor failure as a linear resistance will cause the conduction of a limited current through the varistor that will result in a buildup of heat. This heat buildup may result in catastrophic thermal runaway and the device temperature may exceed a prescribed maximum temperature. For example, the maximum allowable temperature for the exterior surfaces of the device may be set by code or standard to prevent combustion of adjacent components. If the leakage current is not interrupted at a certain period of time, the overheating will result eventually in the failure of the varistor to a short circuit as defined above.

In some cases, the current through the failed varistor could also be limited by the power system itself (e.g., ground resistance in the system or in photo-voltaic (PV) power source applications where the fault current depends on the power generation capability of the system at the time of the failure) resulting in a progressive build up of temperature, even if the varistor failure is a short circuit. There are cases where there is a limited leakage current flow through the varistor due to extended in time overvoltage conditions due to power system failures, for example. These conditions may lead to temperature build up in the device, such as when the varistor has failed as a linear resistance and could possibly lead to the failure of the varistor either as a linear resistance or as a short circuit as described above.

As discussed above, in some cases the SPD module 100 may assume an "end of life" mode in which the varistor wafer 140 is depleted in full or in part (i.e., in an "end of life" state), leading to an end of life failure. When the varistor reaches its end of life, the SPD module 100 will become substantially a short circuit with a very low but non-zero ohmic resistance. As a result, in an end of life condition, a fault current will continuously flow through the varistor even in the absence of an overvoltage condition. In this case, the meltable member 132 can operate as a fail-safe mechanism that by-passes the failed varistor and creates a permanent low-ohmic short circuit between the terminals of the SPD module 100 in the manner described in U.S. Pat. No. 7,433,169, the disclosure of which is incorporated herein by reference.

The meltable member 132 is adapted and configured to operate as a thermal disconnect to electrically short circuit the current applied to the associated SPD module 100 around the varistor wafer 140 to prevent or reduce the generation of heat in the varistors. In this way, the meltable member 132 can operate as switch to bypass the varistor wafer 140 and prevent overheating and catastrophic failure as described above. As used herein, a fail-safe system is "triggered" upon occurrence of the conditions necessary to cause the fail-safe system to operate as described to short circuit the electrodes 122A, 124A.

When heated to a threshold temperature, the meltable member 132 will flow to bridge and electrically connect the electrodes 122A, 124A. The meltable member 132 thereby redirects the current applied to the SPD module 100 to bypass the varistor wafer 136 so that the current induced heating of the varistor ceases. The meltable member 132 may thereby serve to prevent or inhibit thermal runaway (caused by or generated in the varistor wafer 136) without requiring that the current through the SPD module 100 be interrupted.

More particularly, the meltable member 132 initially has a first configuration as shown in FIGS. 3 and 4 such that it does not electrically couple the electrode 124 and the housing 122 except through the head 124A. Upon the occurrence of a heat buildup event, the electrode 124 is thereby heated. The meltable member 132 is also heated directly and/or by the electrode 124. During normal operation, the temperature in the meltable member 132 remains below its melting point so that the meltable member 132 remains in solid form. However, when the temperature of the meltable member 132 exceeds its melting point, the meltable member 132 melts (in full or in part) and flows by force of gravity into a second configuration different from the first configuration. The meltable member 132 bridges or short circuits the electrode 124 to the housing 122 to bypass the varistor wafer 140. That is, a new direct flow path or paths are provided from the surface of the electrode 124 to the surface of the housing sidewall 122B through the meltable member 132. According to some embodiments, at least some of these flow paths do not include the varistor wafer 140.

According to some embodiments, the SPD module 100 is adapted such that when the meltable member 132 is triggered to short circuit the SPD module 100, the conductivity of the SPD module 100 is at least as great as the conductivity of the feed and exit cables or busbars connected to the SPD module 100.

According to some embodiments, the combined thermal mass of the housing (e.g., the housing 122) and the electrode (e.g., the electrode 124) is substantially greater than the thermal mass of each of the varistors captured therebetween. The greater the ratio between the thermal mass of the housing and electrodes and the thermal mass of the varistors, the better the varistors will be preserved during exposure to surge currents and TOV events and therefore the longer the lifetime of the SPD. As used herein, the term "thermal mass" means the product of the specific heat of the material or materials of the object multiplied by the mass or masses of the material or materials of the object. That is, the thermal mass is the quantity of energy required to raise one gram of the material or materials of the object by one degree centigrade times the mass or masses of the material or materials in the object. According to some embodiments, the thermal mass of at least one of the electrode head and the electrode wall is substantially greater than the thermal mass of the varistor. According to some embodiments, the thermal mass of at least one of the electrode head and the electrode wall is at least two times the thermal mass of the varistor, and, according to some embodiments, at least ten times as great. According to some embodiments, the combined thermal masses of the head and the electrode wall are substantially greater than the thermal mass of the varistor, according to some embodiments at least two times the thermal mass of the varistor and, according to some embodiments, at least ten times as great.

While the SPD module 100 has been shown and described including a varistor stack including multiple varistor wafers, other arrangements may be used. For example, a single varistor or multiple varistor wafer stacked in series may be used. In some embodiments a gas discharge tube (GDT) may be stacked in electrical series between the varistor(s)/varistor stack(s) and the electrodes 122, 124.

Figure 15:
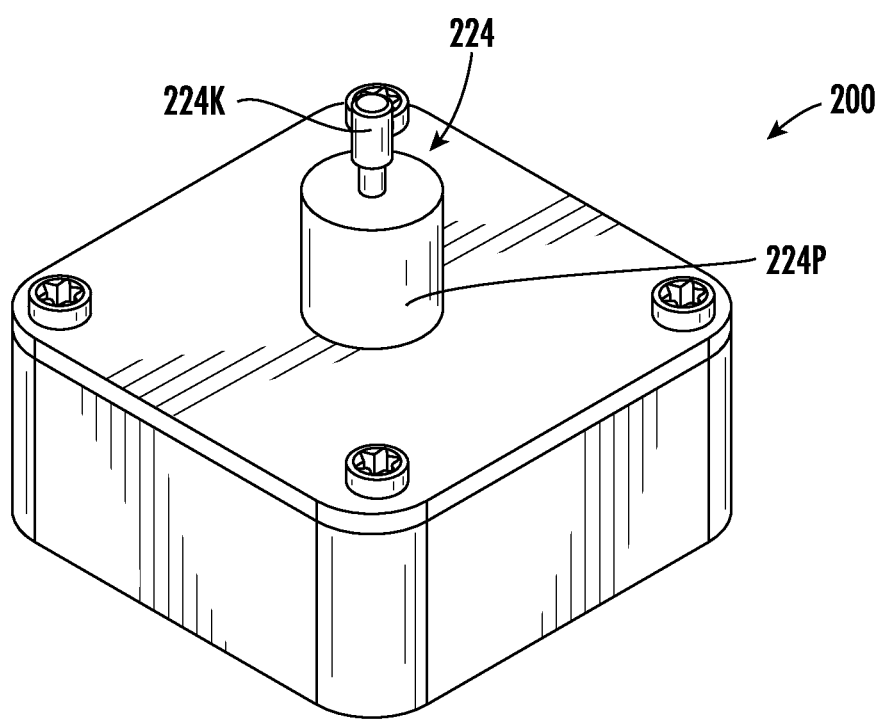
FIG. 15 is a top perspective view of an SPD module according to further embodiments.

With reference to FIG. 15, an SPD or SPD module 200 according to further embodiments is shown therein. The SPD module 200 can be formed and used in the same manner as described for the SPD module 100, except that the neck or post 224P of the piston shaped electrode 224 the SPD module 200 is extended or lengthened and provided with a threaded stud 224K. The extended post 224P and threaded stud 224K may facilitate connections between the piston electrode 224 and busbars or other PCB assemblies.

Figure 16:
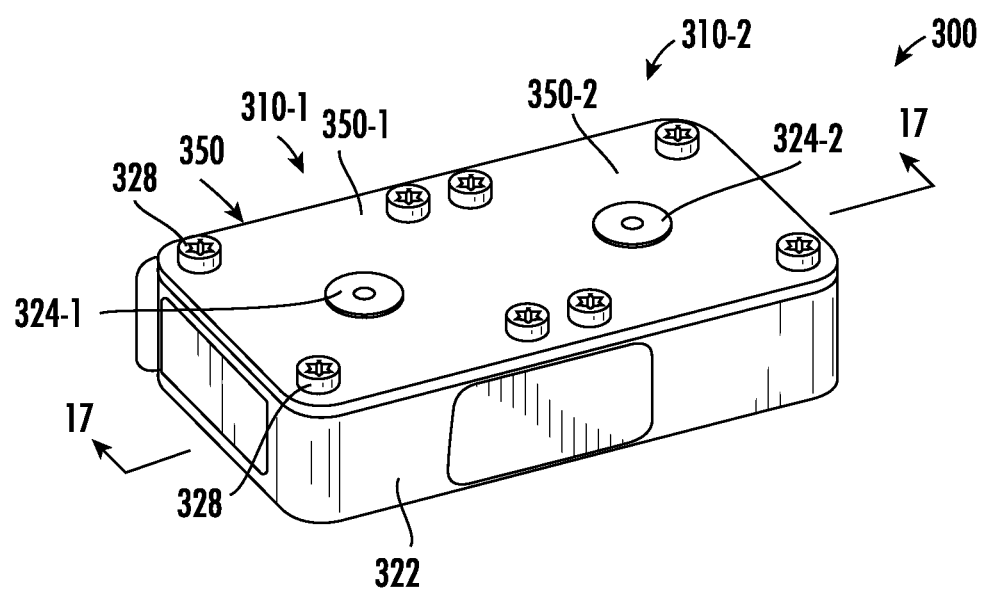
FIG. 16 is a top perspective view of an SPD module according to further embodiments.
Figure 17:
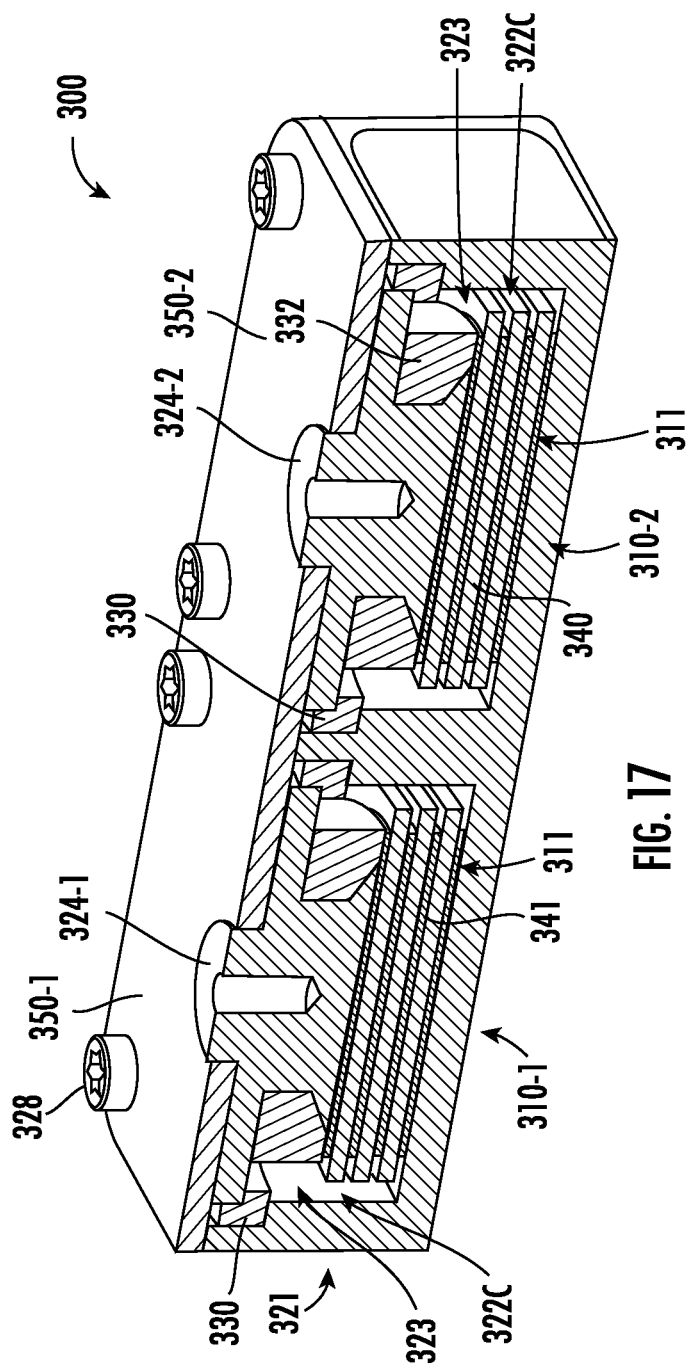
FIG. 17 is a cross-sectional, perspective view of the SPD module of FIG. 16 taken along the line 17-17 of FIG. 16.

With reference to FIGS. 16 and 17, an SPD or SPD module 300 according to further embodiments is shown therein. The SPD module 300 can be formed and used in the same manner as described for the SPD module 100, except that the SPD module 300 incorporates two side-by-side SPD subassemblies 310-1, 310-2 in a single housing electrode 322 and integrated PCB end cap 350 corresponding to the housing electrode 122 and end cap 150 of the SPD module 100.

The SPD module 300 includes a housing assembly 321 including the housing electrode 322, two piston electrodes 324-1, 324-2, end cap fasteners 328, two elastomeric insulator gaskets 330, and a PCB end cap 350 corresponding to the components 122, 124, 128, 130 and 150, respectively. Two side-by-side electrode chambers 322C are defined in the housing electrode 322. The assembled housing assembly 321 defines two sealed SPD chambers 323 corresponding to the sealed chamber 123.

Within each chamber 323 is disposed a respective set 311 including a piston electrode 324-1, 324-2, a varistor stack 341 (including varistors 340), a meltable member 332, an elastomeric gasket 330, and insulating spacers (not visible in FIG. 17). Each set 311 is clamped in its chamber 323 by fasteners 328 and the end cap 350 in the same manner as described for the SPD module 100. The fasteners 328 are threaded into and thereby electrically connected to the housing electrode 322.

The PCB end cap 350 corresponds to the PCB end cap 150 except that the PCB end cap 350 includes a pair of sections 350-1 and 350-2. The PCB end cap section 350-1 overlies and forms the end cap of the SPD subassemblies 310-1. The PCB end cap section 350-2 overlies and forms the end cap of the SPD subassemblies 310-2. The end cap 350 may be a PCB or a portion of a PCB as discussed herein.

The SPD module 300 can be used as a three-pole SPD. A first potential (e.g., Line 1) is connected to the post of the piston electrode 324-1, a second potential (e.g., Line 2) is connected to the post of the piston electrode 324-2, and third potential (e.g., Ground) is connected to the housing electrode 322 by one of the screws 328. In this case, the post of the piston electrode 324-1 serves as a first electrical terminal, the post of the piston electrode 324-2 serves as a second electrical terminal, and the screw 328 serves as a third electrical terminal of the SPD module 300.

Figure 18:
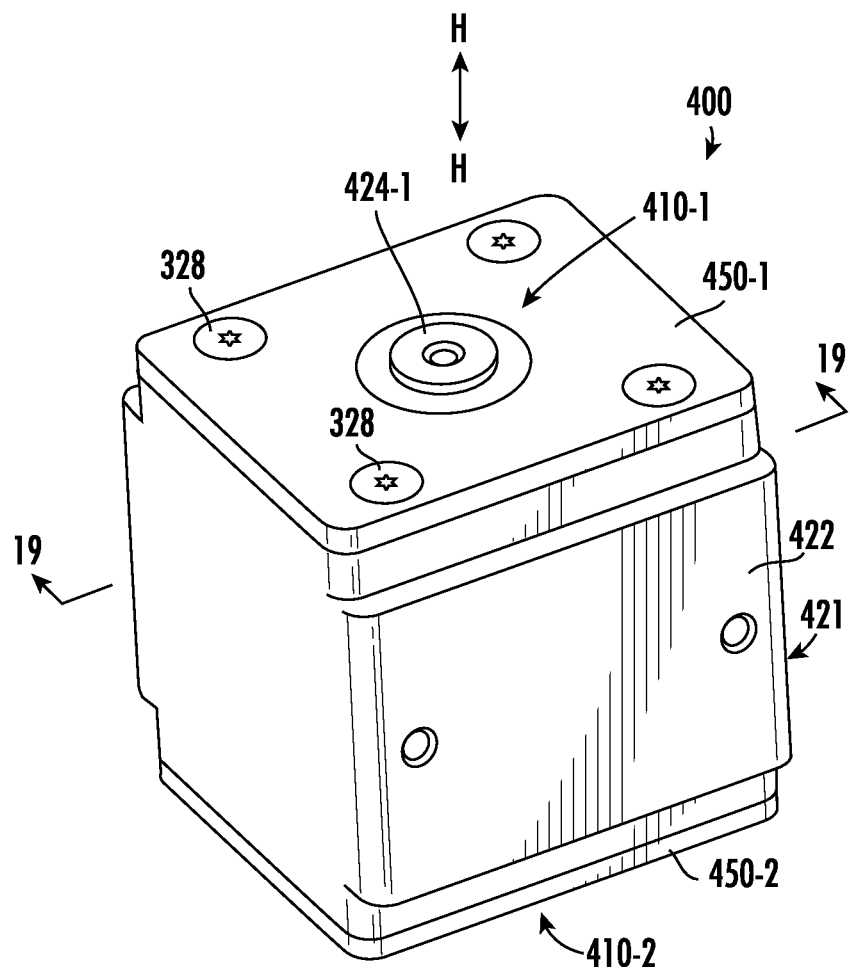
FIG. 18 is a top perspective view of an SPD module according to further embodiments.
Figure 19:
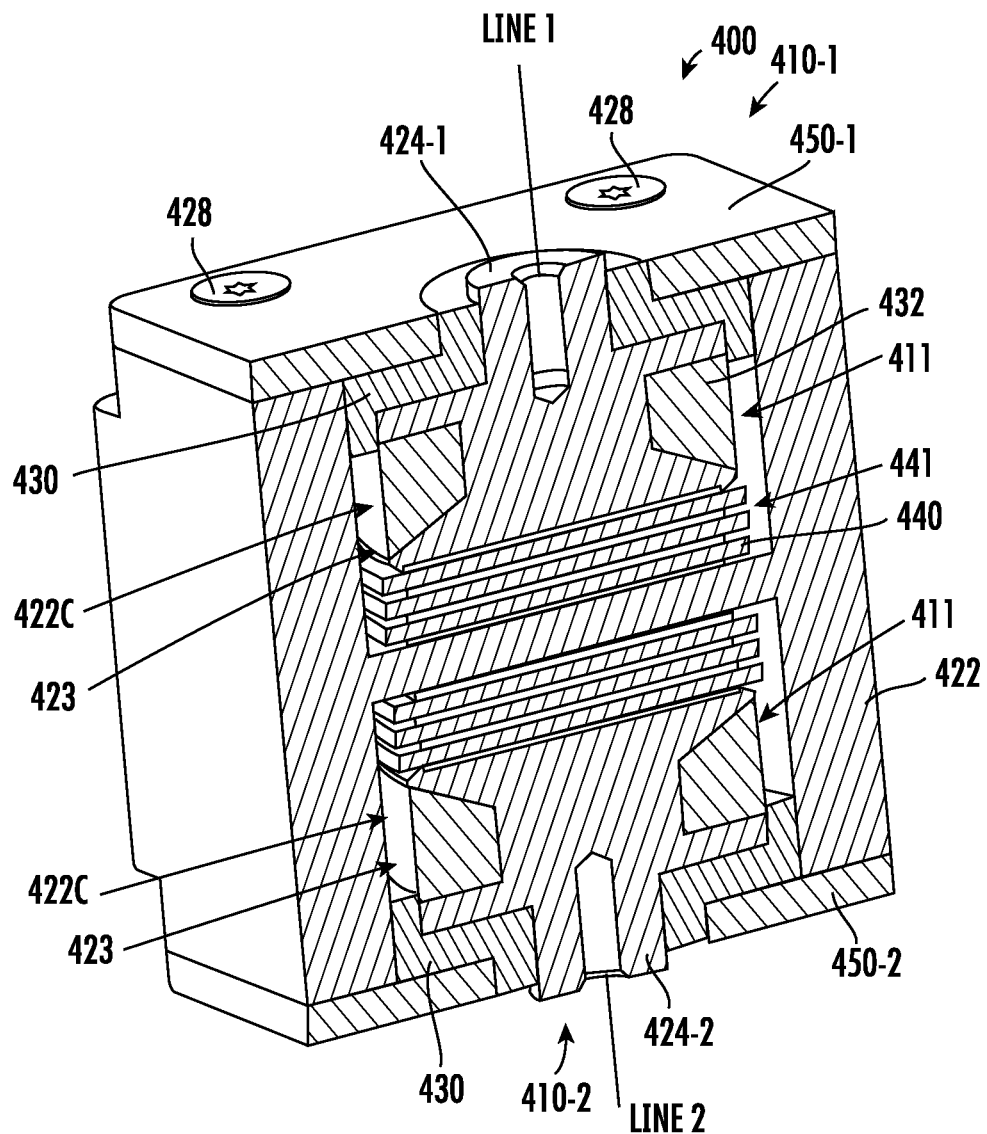
FIG. 19 is a cross-sectional, perspective view of the SPD module of FIG. 18 taken along the line 19-19 of FIG. 18.

With reference to FIGS. 18 and 19, an SPD or SPD module 400 according to further embodiments is shown therein. The SPD module 400 can be formed and used in the same manner as described for the SPD module 100, except that the SPD module 400 incorporates two opposed, back-to-back (along the SPD axis H-H) SPD subassemblies 410-1, 410-2 in a single housing electrode 422 with two integrated PCB end caps 450-1, 450-2 corresponding to the housing electrode 122 and end cap 150 of the SPD module 100.

The SPD module 400 includes a housing assembly 421 including the housing electrode 422, two piston electrodes 424-1, 424-2, end cap fasteners 428, two elastomeric insulator gaskets 430, and the end caps 450-1, 450-2 corresponding to the components 122, 124, 128, 130 and 150, respectively. Two opposed electrode chambers 422C are defined in the housing electrode 422. The assembled housing assembly 421 defines two sealed SPD chambers 423 corresponding to the sealed chamber 123.

Within each chamber 423 is disposed a respective set 411 including a piston electrode 424-1, 424-2, a varistor stack 441 (including varistors 440), a meltable member 432, an elastomeric gasket 430, and insulating spacers (not visible in FIG. 19). Each set 411 is clamped in its chamber 423 by fasteners 428 and its associated end cap 450-1, 450-2 in the same manner as described for the SPD module 100.

The PCB end caps 450-1 and 450-2 overly and form the end caps of the SPD subassemblies 410-1 and 410-2, respectively. The PCB end cap section 450-2 overlies and forms the end cap of the SPD subassemblies 410-2. The PCB caps 450-1, 450-2 may each be a PCB or a portion of a PCB as discussed herein.

Each set 411 is clamped in its chamber 423 by fasteners 428 and the end cap 450-1, 450-2 in the same manner as described for the SPD module 100. The fasteners 428 are threaded into and thereby electrically connected to the housing electrode 422.

The SPD module 400 also differs from the SPD module 100 in that the elastomeric gaskets 430 are interposed and clamped between the end caps 450-1, 450-2 and the piston electrodes 424, and the electrodes chambers 422C are not stepped. In this arrangement, the elastically deformed gaskets 423 will seal the chambers 423. In this arrangement, the elastically deformed gaskets 430 will also provide a persistent load against the piston electrode 424 to assist in clamping the varistor stack between the electrodes 422, 424.

The SPD module 400 can be used as a three-pole SPD. A first potential (e.g., Line 1) is connected to the post of the piston electrode 424-1, a second potential (e.g., Line 2) is connected to the post of the piston electrode 424-2, and third potential (e.g., Ground) is connected to the housing electrode 422 by one of the screws 428. In this case, the post of the piston electrode 424-1 serves as a first electrical terminal, the post of the piston electrode 424-2 serves as a second electrical terminal, and the screw 428 serves as a third electrical terminal of the SPD module 400.

As discussed above, in some embodiments an SPD as disclosed herein (e.g., the SPD 100, 200, 300, or 400) is directly mounted on, integrated into, or incorporated with a PCB assembly (PCBA). In some embodiments, the housing electrode (e.g., 122, 222, 322, or 422) is secured to the PCB end cap (e.g., 150, 250, 350, 450-1, 450-2) and electrically connected to an electrically conductive trace of the PCB. In some embodiments, the PCB, or a portion thereof, forms the PCB end cap of the SPD.

In some embodiments the end cap is a PCB and the PCB forms a structural component of the SPD. The PCB end cap forms a part of the SPD housing assembly that defines the SPD chamber within which the varistor stack is contained. The PCB (e.g., 150, 250, 350, 450-1, 450-2) also serves as a structural component of housing assembly that maintains the loading of the electrodes on the varistor stack.

The PCB-mounted SPD can provide multiple advantages, including: allows integration on telecommunications equipment PCB assemblies (PCBA) (where space is not readily available); and no lead lengths (as connection to power lines is done through the PCBA traces) that could increase the let though voltage to the equipment and also special internal construction to fail in a safe manner during the short circuit current tests specified by UL 1449 standard for DC SPDs.

SPDs as disclosed herein include novel design features that allow or facilitate the integration to the PCBA. The insulation between piston electrode (e.g., piston electrode 124) and housing electrode (e.g., housing electrode 122) is provided by the PCBA itself. The construction is made in such a way that the PCBA could also withstand the pressure and forces during surge current conduction and failure (short circuit conditions).

Figure 20:
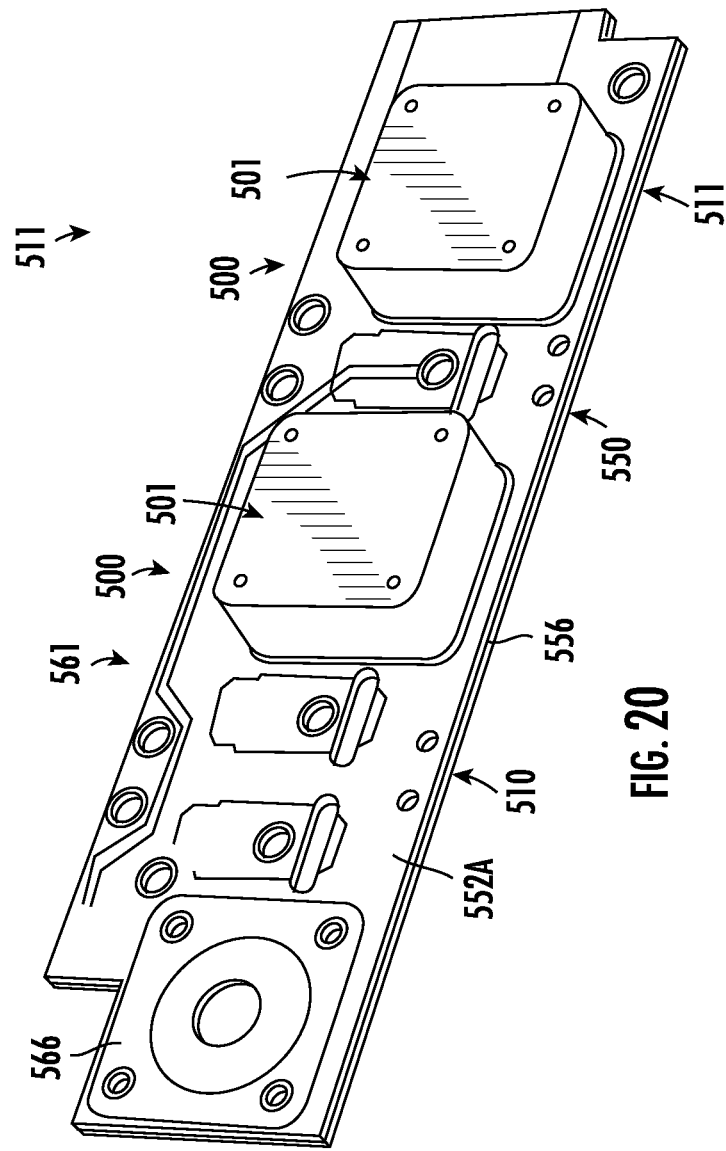
FIG. 20 is a bottom perspective view of a PCB assembly according to further embodiments.
Figure 21:
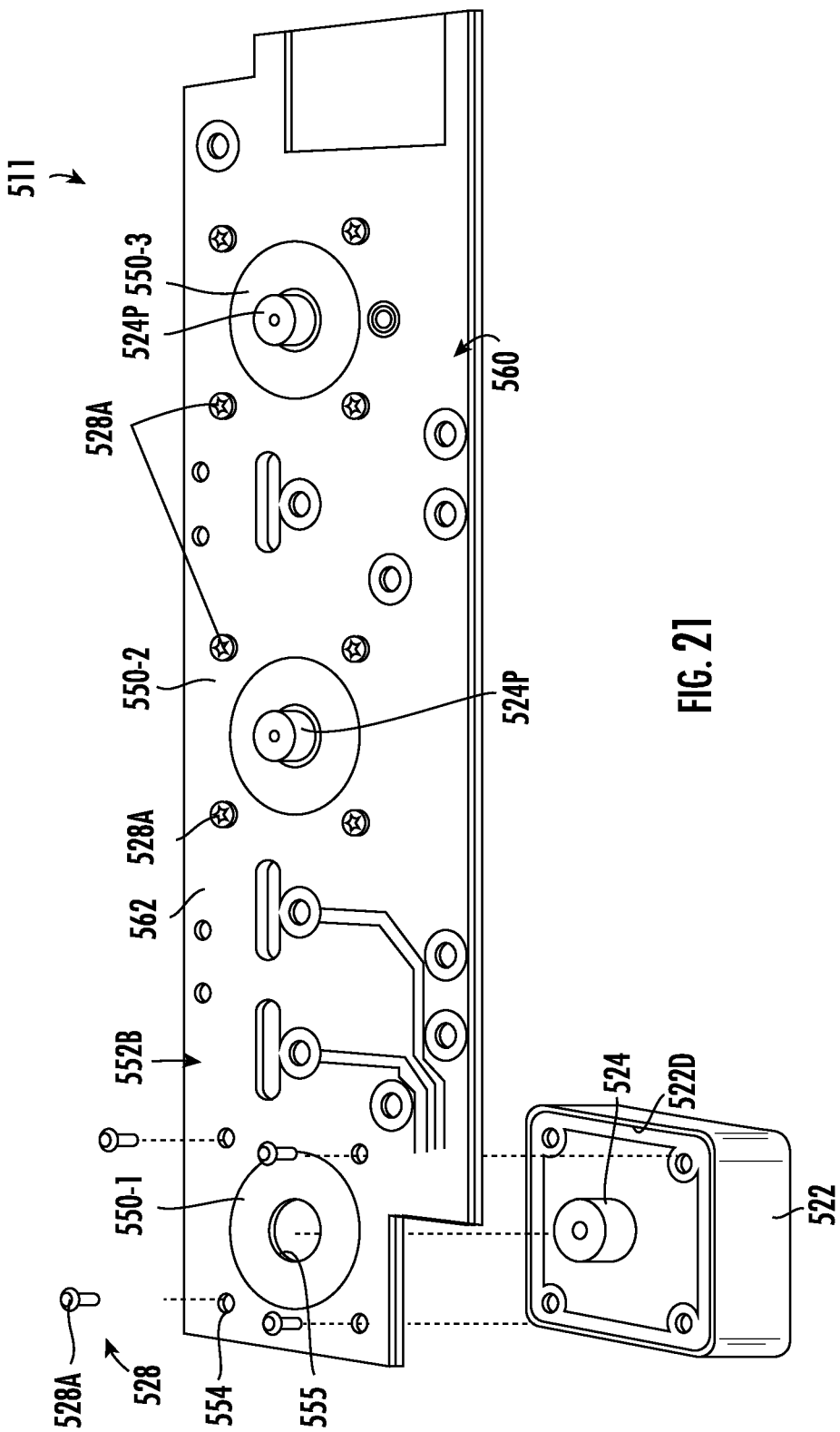
FIG. 21 is a top perspective view of the PCB assembly according of FIG. 20.

With reference to FIGS. 20 and 21, an example SPD module in the form of a PCB assembly 511 according some embodiments is shown therein. The PCBA 511 includes a PCBA subassembly 510 and three SPD subassemblies 501 (only two are shown in the figures). The SPD subassemblies 501 and portions of the PCBA subassembly 510 combine to form three SPDs 500 each corresponding to one of the SPDs 100.

The PCBA subassembly 510 includes a PCB 550. The PCB 550 includes a PCB substrate 556 and a plurality or pattern(s) of electrically conductive (e.g., copper) layers 560 laminated to the substrate and embodied in the PCB 550, as is well known in the art. These electrically conductive layers may include electrically conductive traces, pads, vias, and/or plated through-holes, for example.

The PCB 550 has an inner face 552A and an opposing outer face 552B. Fastener holes 554 and three post holes 555 are defined in the PCB 550. The PCB 550 includes side-by-side sections 550-1, 550-2, and 550-3.

At least a portion of an electrical circuit 561 is embodied in the PCB 550 on the PCB substrate 556. The electrical circuit 561 may include various electrical components and connections (e.g., electrical traces, etc.) that are formed in or mounted on the PCB 550, as is well known in the art. In some embodiments, the PCBA 511 includes the PCB 550 and electronic components mounted on and electrically connected to or integrated with the PCB 550. In some embodiments, the PCBA 511 consists of only the SPD subassemblies 501 and the PCB 550 (i.e., without other electronic components mounted on and electrically connected to or integrated with the PCB 550).

Each SPD subassembly 501 includes all the components of the SPD 100 except the end cap 150. The SPDs 500 are each constructed the same as the SPD module 100 except that, as will be appreciated from FIGS. 20 and 21, the PCB 550 forms the end cap of multiple SPDs 500. More particularly, each section 550-1, 550-2, 550-3 forms the integrated end cap of a respective one of the SPDs 500.

Each SPD subassembly 501 is mechanically secured to the PCB 550 by screws 528 such that the overlapping portion 550-1, 550-2, 550-3 of the PCB 550 presses the piston electrode 524 toward the varistor stack and closes the opening 522D of the housing electrode 522. The connections of one SPD 500 will be described below, and this description applies likewise to the other SPDs 500.

The portion of the PCB 550 facing or engaging the piston electrode 524 is electrically insulating or an electrically insulating component is provided between that portion and the piston electrode 524. In some embodiments, an electrically insulating layer or coating 566 (e.g., a polypropylene layer) is provided between the PCB 550 and the remainder of the SPD module 500. For example, the insulating layer may cover the entire area of the PCB 550 overlapped by the housing electrode 522 except the hole that receives the piston electrode neck or post 524P.

The post 524P projects through a respective hole 555 in the PCB 550. A busbar, cable or other suitable conductor (not shown) may be connected to the post 524P.

In some embodiments, the housing electrode 522 is electrically connected to a conductive trace of the PCB 550. In some embodiments, the housing electrode 524 is electrically connected to a conductive layer or trace 562 of the PCB 550 by the mounting screws 528. In the illustrated example, the heads 528A of the screws 528 make electrical contact with the trace 562 on the side of the PCB 550 opposite the housing electrode 522. The trace 562 may be an electrical ground layer (e.g., a PCB ground plane) of the PCB 550, for example.

In some embodiments (not shown), the housing electrode 522 is electrically connected to a conductive layer or trace of the PCB 550 by direct contact between the housing electrode 522 and the trace, instead of or in addition to the connection through the mounting screws 528.

In some embodiments, in use, each SPD 500 is connected to a first electrical potential (for example, Line) by a conductor (e.g., a cable or busbar) connected to the post 524P, and is connected to a second electrical potential (for example, Ground) through the trace 562 (which is connected to the housing electrode 522 through the screws 528). In this case, the post 524P serves as a first electrical terminal and the trace 562 serves as a second electrical terminal of the SPD 500.

Figure 22:
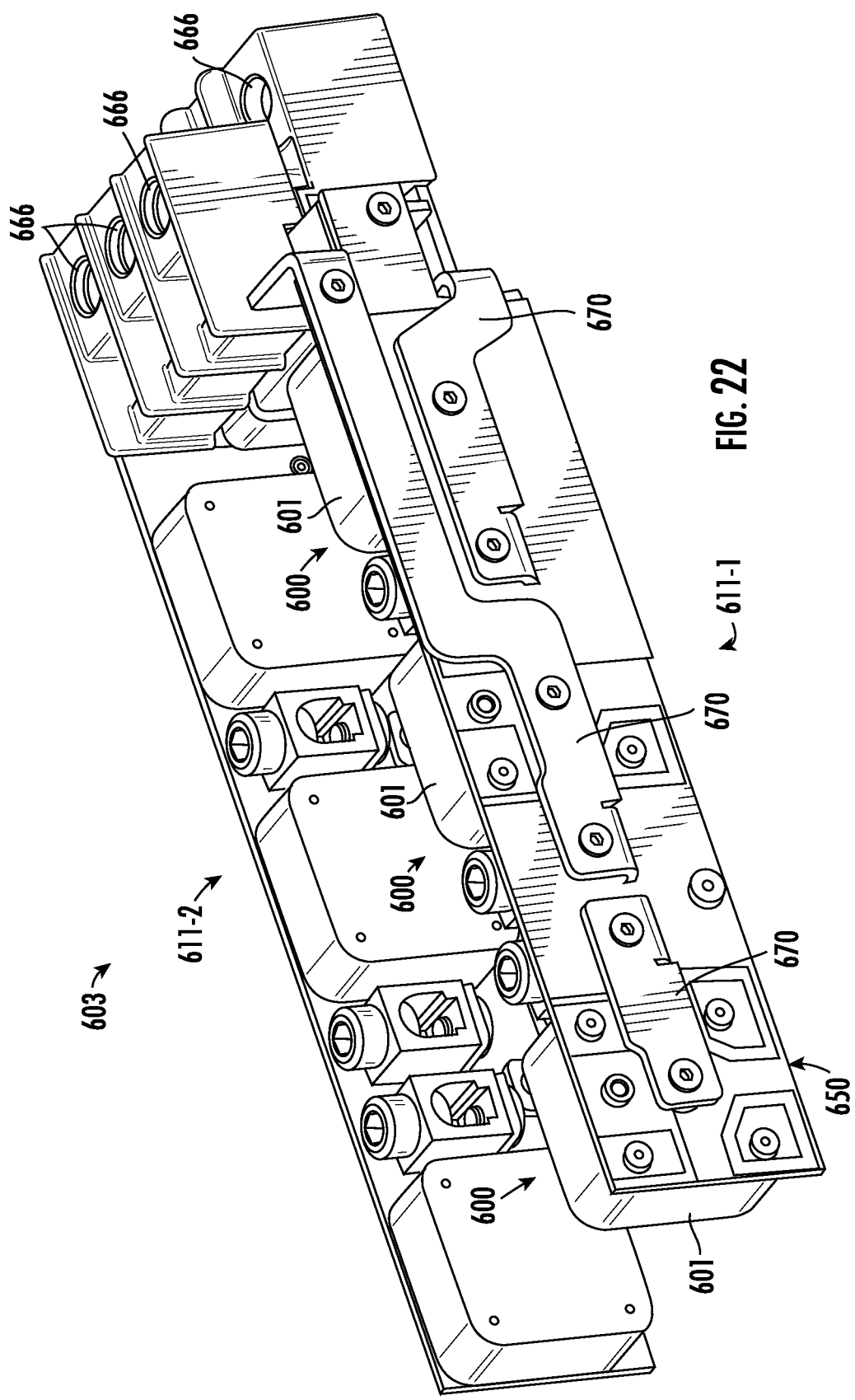
FIG. 22 is a top perspective view of an SPD unit according to further embodiments.
Figure 23:
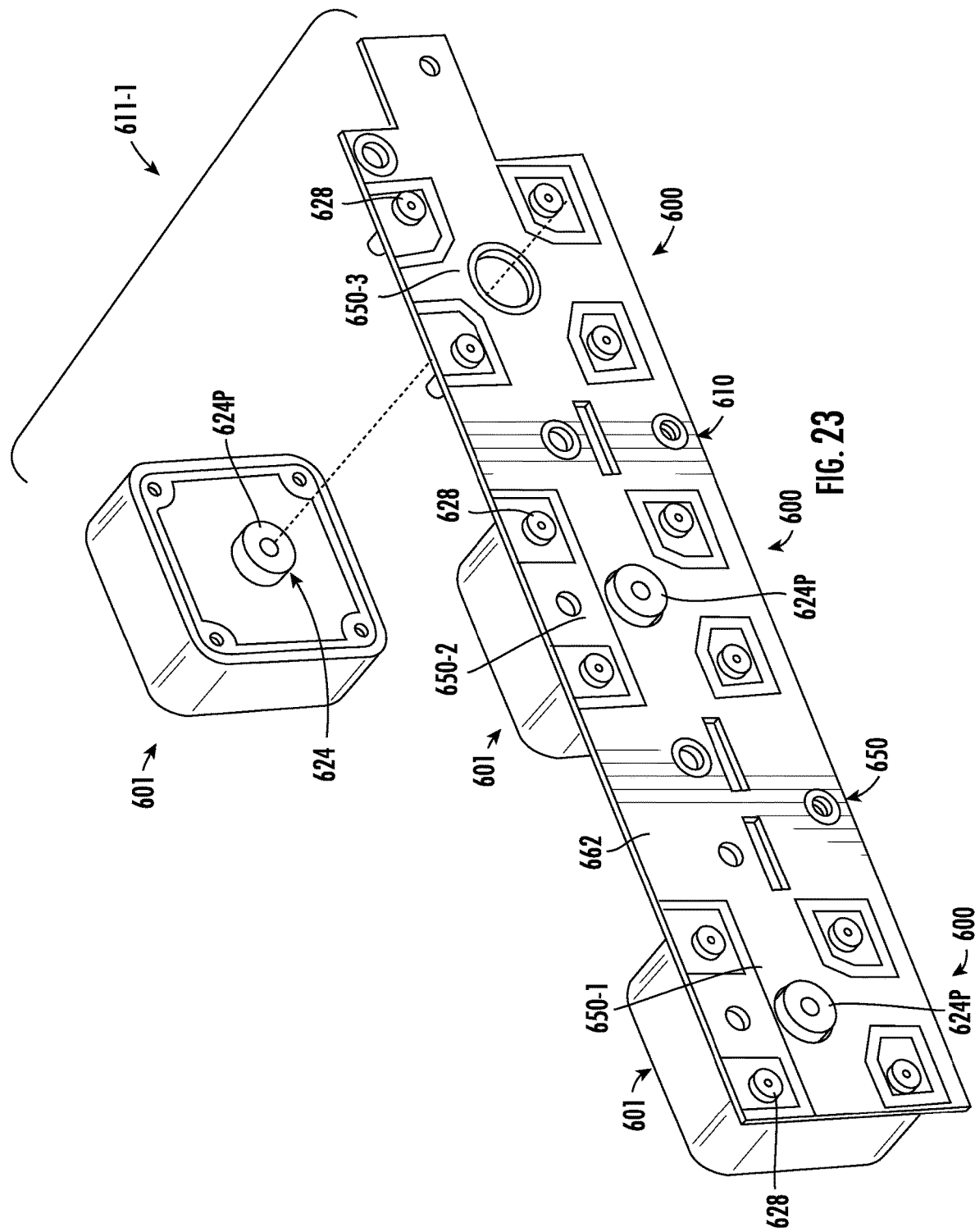
FIG. 23 is an exploded, top perspective view of a PCB assembly of the SPD unit of FIG. 22.
Figure 24:
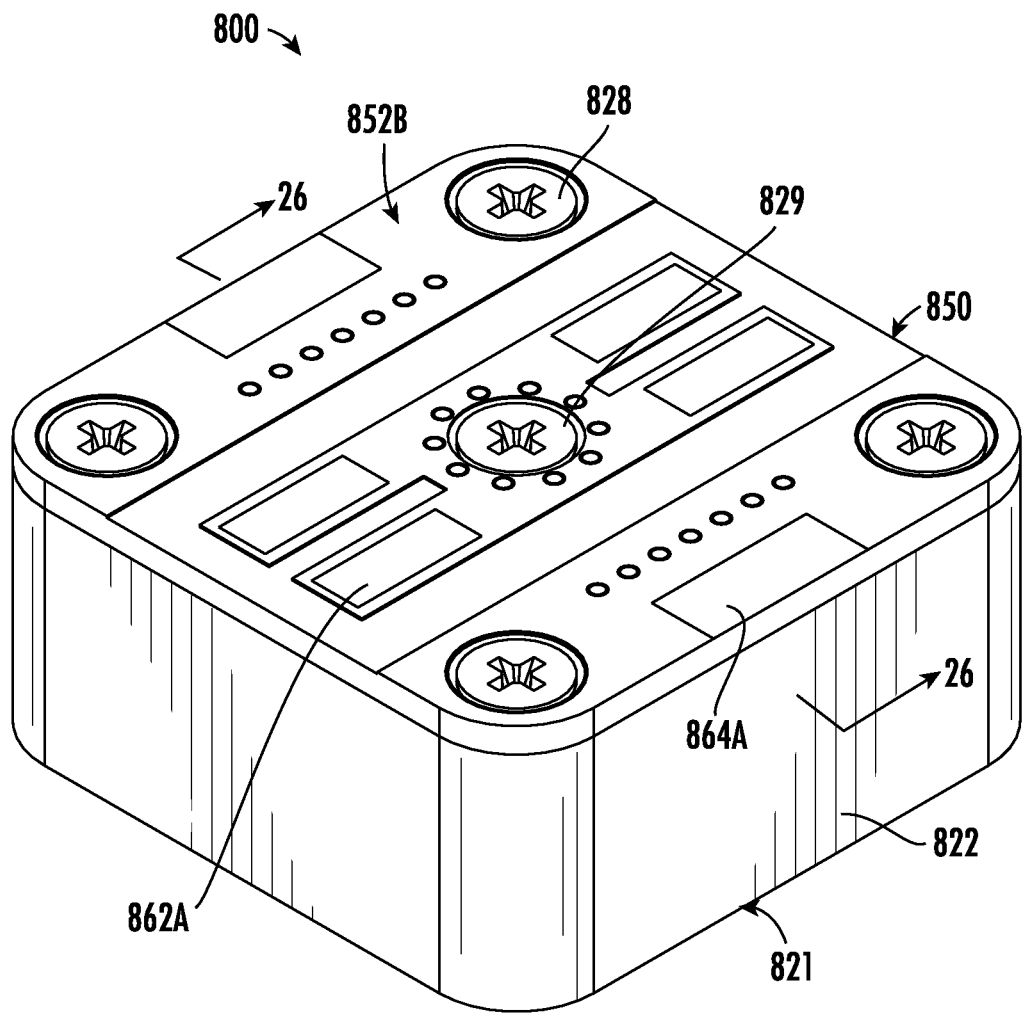
FIG. 24 is a top perspective view of an SPD module according to further embodiments.
Figure 25:
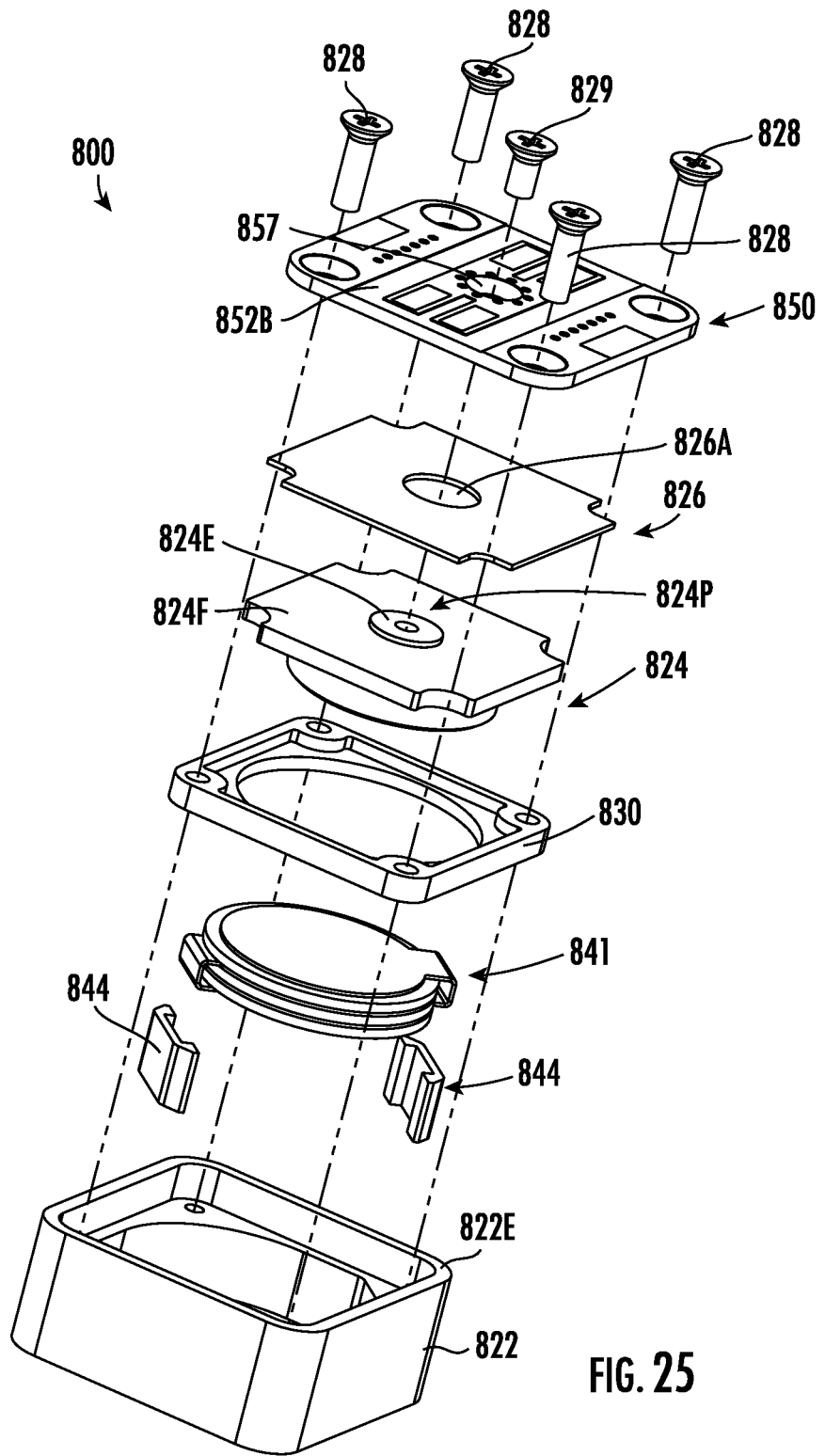
FIG. 25 is an exploded, top perspective view of the SPD module of FIG. 24.
Figure 26:
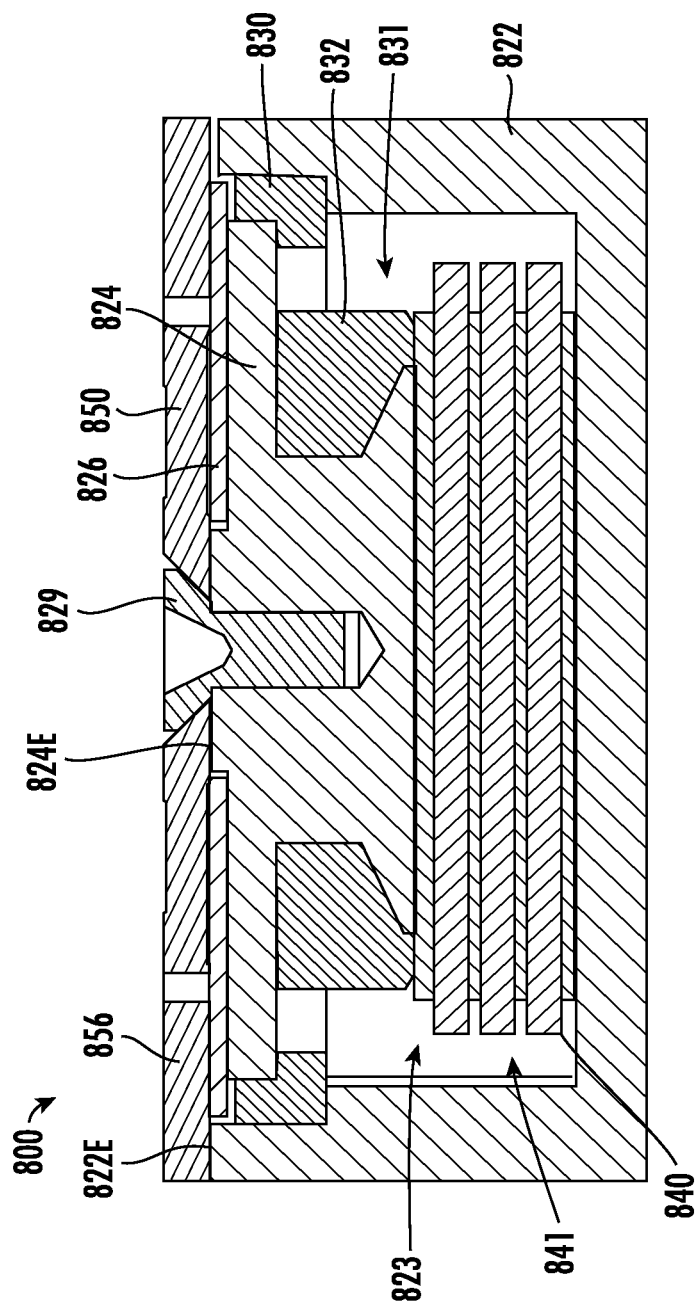
FIG. 26 is a cross-sectional, perspective view of the SPD module of FIG. 24 taken along the line 26-26 of FIG. 24.

FIGS. 22 and 23 show an example SPD unit 603 according to some embodiments incorporating two SPD modules in the form of PCB assembly modules 611-1, 611-2. The PCB assemblies 611-1, 611-2 may be constructed and operate in substantially the same manner. The PCB assembly 611-1 is described in more detail below and it will be appreciated that this description likewise applies to the PCB assembly 611-2.

The PCB assembly module 611-1 includes a PCBA subassembly 610 and three SPD subassemblies 601 (only two are shown in the figures). The SPD subassemblies 601 and portions of the PCBA subassembly 610 combine to form three SPDs 600 each corresponding to one of the SPDs 100.

The PCB assembly 611 is constructed in generally the same manner as the PCB assembly 511 except that the connections to the piston electrodes 624 are made using busbars 670 that are integrated with the PCB assembly 611 and directly mounted on the PCB 650. Respective portions or sections 650-1, 650-2, 650-3 of the PCB 650 serve as the integrated PCB end cap for each SPD module 600.

In some embodiments, one or more of the busbars 670 is electrically connected with an electrical connector by a trace of the PCB 650. That is, the connector is connected to the piston electrode 624 via the trace and the busbar 670.

The housing electrodes 622 are electrically connected to traces 662 of the PCB 650 by the screws 628. In some embodiments, the traces 662 connect the housing electrode 622 to electrical Ground (G). In some embodiments, the traces 662 are a ground plane of the PCB 650.

In some embodiments, in use, each SPD 600 is connected to a first electrical potential (for example, Line) by a busbar 670 connected to its post 624P, and is connected to a second electrical potential (for example, Ground) through the trace 662 (which is connected to the housing electrode 622 through the screws 628). In this case, the post 624P serves as a first electrical terminal and the trace 662 serves as a second electrical terminal of the SPD 600.

In some embodiments, each piston electrode 624 is electrically connected to a respective one of six electrical connectors 666 (e.g., cable connectors) by respective busbars 670.

In some embodiments, in use, each SPD 600 is connected to a first electrical potential (for example, a Line 1, Line 2 or Line 3) by a busbar 670 connected to its post 624P and a respective one of the electrical connectors 666, and is connected to a second electrical potential (for example, Ground (G)) through the trace 662.

With reference to FIGS. 24-28, an SPD module 800 according to further embodiments is shown therein. The SPD module 800 is constructed and used in the same manner as described for the SPD module 100, except as discussed below.

The SPD module 800 includes a housing assembly 821 (defining a sealed SPD chamber 823), a varistor stack 841 (including one or more varistor wafers 840), a pair of electrical insulator spacers 844, and an integral fail-safe mechanism 831 (including a meltable member 832) corresponding to the components 121, 141, 144, and 131, respectively.

The housing assembly 821 includes a housing electrode 822, a piston electrode 824, end cap fasteners 828, a piston electrode fastener 829, an elastomeric insulating gasket 830, and an integrated PCB end cap 850 corresponding to the components 122, 124, 128, 130 and 150, respectively, except as discussed below.

The SPD module 800 further includes an electrical insulation plate 826 interposed between the flange 824F of the piston electrode 824 and the inner side of the PCB end cap 850. The insulation plate 826 includes an opening 826A that receives the post 824P of the piston electrode 824.

The PCB end cap 850 differs from the PCB end cap 150 in that the PCB end cap 850 includes integral electrically conductive layers to enable electrical connections between the SPD module 800 and electrical power lines and between the SPD module 800 and a remote monitoring device 9.

Figure 27:
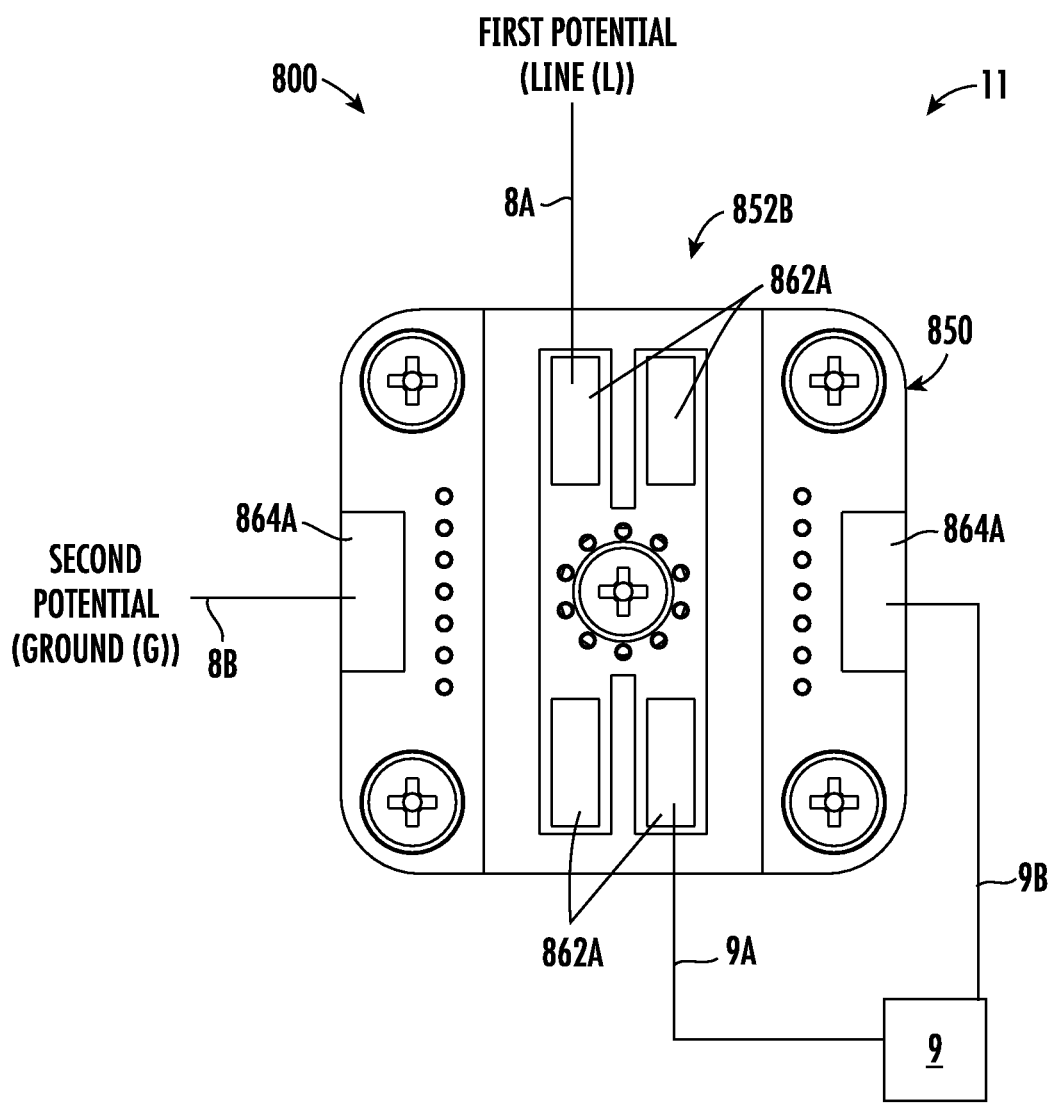
FIG. 27 is a top view of the SPD module of FIG. 24 incorporated into an electrical power supply system including a remote monitoring system.
Figure 28:
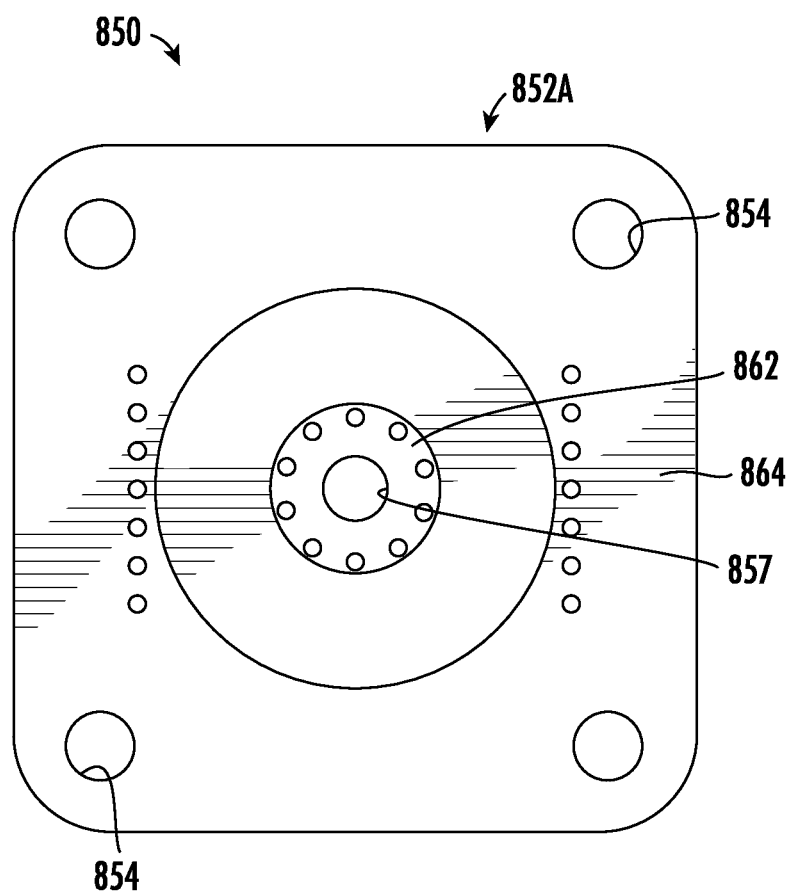
FIG. 28 is a bottom view of a PCB end cap of the SPD module of FIG. 24.

The PCB end cap 850 has an inner face 852A (FIG. 28) and an opposing outer face 852B (FIG. 27). Fastener holes 854 and a piston fastener hole 857 are defined in the PCB end cap 850. The PCB end cap 850 includes an electrically insulative substrate 856 and electrically conductive layers (e.g., copper layers) thereon. The conductive layers include an annular inner or first trace 862 (on the inner face 852A) electrically connected to a pair of first terminals or first contact pads 862A (on the outer face 852B). The conductive layers also include an annular outer or second trace 864 (on the inner face 852A) electrically connected to a pair of second terminals or second contact pads 864A (on the outer face 852B).

The end face 822E of the housing electrode 822 engages the second trace 864 to electrically connect the housing electrode 822 to the second contact pads 864A. In some embodiments, the fastener holes 854 are also layered in metal electrically connected to the second contact pads 864A.

The end face 824E of the piston electrode 824 engages the first trace 862 to electrically connect the piston electrode 824 to the first contact pads 862A. The piston electrode fastener 829 extends through the fastener hole 857 and affixes the piston electrode 824 to and in engagement with the first trace 862 of the PCB 850. In some embodiments, the fastener hole 857 is also layered in metal electrically connected to the first contact pads 862A.

FIG. 27 shows an electrical power supply system or circuit 11 including the SPD module 800. In some embodiments and with reference to FIG. 27, in use, the SPD module 800 is connected to a first electrical potential (for example, Line) by a conductor or lead 8A connected to one of the first contact pads 862A, and is connected to a second electrical potential (for example, Ground (G)) by a conductor or lead 8B connected to one of the second contact pads 864A. The conductor 8A is thereby connected the piston electrode 824 and the conductor 8B is thereby connected the housing electrode 822. In this case, the first contact pad 862A serves as a first electrical terminal and the second contact pad 864A serves as a second electrical terminal of the SPD module 800.

The remote monitoring device 9 is electrically and operatively connected to the SPD module 800 by remote leads 9A, 9B. The lead 9A is connected to one of the first contact pads 862A and the lead 9B is connected to one of the second contact pads 864A.

The remote monitoring device 9 will receive signals from the PCB end cap 850 via the contact pads 862A, 864A corresponding to the operating status or condition of the SPD module 800. The remote monitoring device 9 may be any suitable device or circuit operative to detect and process the signals. In some embodiments, the remote monitoring device 9 can detect voltage across the SPD module 800 and/or current through the SPD module 800.

Multiple first contact pads 862A and multiple second contact pads 864A are provided to provide more flexibility in connecting the leads 8A, 8B 9A, 9B, depending on the orientation of the SPD module 800 with respect to other components (circuitry) of the PCB end cap 850.

SPDs according to embodiments of the invention can be directly mounted on a PCB. One or both of the electrodes can be part of the PCB copper traces.

The surge protection device may utilize ceramic spacers (Alumina, Zirconia, Boron nitride, Yttria etc.) to automatically align the varistors, without any need for additional insulating material (apart from atmospheric air).

The top elastomer part (e.g., the rubber gasket 130) provides dielectric insulation between the two electrodes (e.g., the electrodes 122, 124) and enough pressure to ensure low resistance contact between the electrodes and the varistors.

The SPD can include SPD subassemblies, including respective varistor stacks, in side-by-side or back-to-back configuration for double surge protection of different potential electrodes.

According to some embodiments, SPDs as disclosed herein can withstand high short circuit current in case of safe failure mode (1-25 kAdc or ACrms).

According to some embodiments, the electrodes of the SPD are designed in a way to provide homogenous electric field in order to increase the dielectric strength and decrease the required creepage and clearance distance, in a way that surge protection device can withstand high lightning surges without any flashover.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A surge protective device (SPD) module comprising:
   a printed circuit board (PCB);
   a first electrode comprised of a housing electrode defining a cavity and a housing electrode opening communicating with the cavity;
   a second electrode; and
   a varistor electrically connected between the first and second electrodes and contained in the cavity;
   wherein:
     the SPD module forms a housing assembly defining a chamber containing the varistor; and
     the PCB forms a portion of the housing assembly and closes the housing electrode opening to enclose the chamber.

2. The SPD module of claim 1 wherein:
   the second electrode is a piston electrode extending into the cavity; and
   the varistor is disposed in the cavity between the housing electrode and the piston electrode.

3. The SPD module of claim 2 wherein:
   the PCB includes a hole defined therein; and
   an integral terminal post of the piston electrode extends through the hole.

4. The SPD module of claim 1 wherein:
   the SPD module includes a varistor stack including a stack of varistor members;
   the varistor stack is electrically connected between the second electrode and the housing electrode;
   the varistor stack includes at least one electrically conductive interconnect member connecting at least two of the varistor members in electrical parallel between the second electrode and the housing electrode;
   the SPD module includes a spacer formed of an electrically insulating material;
   the spacer includes a receiver recess; and
   a portion of the interconnect member extends outwardly beyond the plurality of varistor members and is disposed in the receiver recess.

5. The SPD module of claim 1 including:
   an integral fail-safe mechanism including an electrically conductive, meltable member;
   wherein the meltable member is responsive to heat in the SPD module to melt and form a short circuit current flow path through the meltable member, between the second electrode and the housing electrode and bypassing the varistor.

6. The SPD module of claim 1 wherein the housing electrode is electrically connected to an electrically conductive trace of the PCB.

7. The SPD module of claim 6, wherein:
   the SPD module includes an electrically conductive fastener securing the PCB to the housing electrode; and
   the housing electrode is electrically connected to the electrically conductive trace of the PCB through the electrically conductive fastener.

8. The SPD module of claim 6 wherein the electrically conductive trace is a ground plane of the PCB.

9. The SPD module of claim 6 wherein the second electrode is electrically connected to a second electrically conductive trace of the PCB.

10. The SPD module of claim 9 wherein the PCB includes:
    an integral first terminal electrically connected to the first electrically conductive trace; and
    an integral second terminal electrically connected to the second electrically conductive trace.

11. The SPD module of claim 1 including an elastomeric gasket member that is maintained in an elastically compressed state by the PCB to seal the chamber.

12. The SPD module of claim 1 wherein:
    the PCB includes a first PCB section and a second PCB section;
    the SPD module further includes:
      a third electrode; and
      a second varistor electrically connected between the third electrode and the first electrode;
    the SPD module forms a second chamber containing the second varistor;
    the SPD module includes:
      an integral first SPD subassembly including the first and second electrodes, the first varistor, and the first PCB section; and
      an integral second SPD subassembly including the first and third electrodes, the second varistor, and the second PCB section.

13. The SPD module of claim 1 wherein:
    the SPD module includes:
      a second PCB;

a third electrode; and
a second varistor electrically connected between the third electrode and the first electrode;
the SPD module forms a second chamber containing the second varistor;
the SPD module includes:
an integral first SPD subassembly including the first and second electrodes, the first varistor, and the first PCB; and
an integral second SPD subassembly including the first and third electrodes, the second varistor, and the second PCB.

14. The SPD module of claim 1 wherein:
the PCB includes a first PCB section and a second PCB section;
the SPD module further includes:
a third electrode;
a fourth electrode; and
a second varistor electrically connected between the third and fourth electrodes;
the SPD module forms a second housing assembly defining a second chamber containing the second varistor;
the first PCB section forms a portion of the first housing assembly; and
the second PCB section forms a portion of the second housing assembly.

15. The SPD module of claim 1 wherein the PCB is secured to the first electrode such that the second electrode is clamped between the PCB and the first electrode and is loaded against the varistor.

16. A printed circuit board assembly comprising:
a printed circuit board (PCB);
a surge protective device (SPD) subassembly mounted on the PCB, the SPD subassembly including:
a first electrode comprised of a housing electrode defining a cavity and a housing electrode opening communicating with the cavity;
a second electrode; and
a varistor electrically connected between the first and second electrodes and contained in the cavity;
wherein the first electrode and the PCB each form parts of a housing assembly defining a chamber containing the varistor and the PCB closes the housing electrode opening to enclose the chamber.

17. The printed circuit board assembly of claim 16 wherein the PCB is secured to the first electrode such that the second electrode is clamped between the PCB and the first electrode and is loaded against the varistor.

18. A power supply circuit comprising:
a surge protective device (SPD) module comprising:
a printed circuit board (PCB);
a first electrode comprised of a housing electrode defining a cavity and a housing electrode opening communicating with the cavity;
a second electrode; and
a varistor electrically connected between the first and second electrodes and contained in the cavity;
wherein:
the SPD module forms a housing assembly defining a chamber containing the varistor; and
the PCB forms a portion of the housing assembly and closes the housing electrode opening to enclose the chamber;
a first electrical line at a first electrical potential connected to the first electrode; and
a second electrical line at a second electrical potential connected to the second electrode.

19. The power supply circuit of claim 18 including:
a remote monitoring device;
a first remote monitor line connected to the first electrode through the PCB; and
a second remote monitor line connected to the second electrode through the PCB.

20. The power supply circuit of claim 18 wherein the PCB is secured to the first electrode such that the second electrode is clamped between the PCB and the first electrode and is loaded against the varistor.

* * * * *